(12) United States Patent
Tel et al.

(10) Patent No.: US 12,044,979 B2
(45) Date of Patent: Jul. 23, 2024

(54) COMPUTATIONAL METROLOGY BASED SAMPLING SCHEME

(71) Applicant: ASML NETHERLANDS B.V., Veldhoven (NL)

(72) Inventors: Wim Tjibbo Tel, Helmond (NL); Yichen Zhang, Eindhoven (NL); Sarathi Roy, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 18/122,655

(22) Filed: Mar. 16, 2023

(65) Prior Publication Data

US 2023/0221654 A1    Jul. 13, 2023

Related U.S. Application Data

(63) Continuation of application No. 16/959,736, filed as application No. PCT/EP2018/085153 on Dec. 17, 2018, now Pat. No. 11,635,698.

(30) Foreign Application Priority Data

Jan. 24, 2018 (EP) .................................. 18153189
Aug. 20, 2018 (EP) .................................. 18189752

(51) Int. Cl.
*G03F 7/00* (2006.01)
*G06F 17/18* (2006.01)
*G06F 18/24* (2023.01)

(52) U.S. Cl.
CPC .......... *G03F 7/705* (2013.01); *G03F 7/70633* (2013.01); *G06F 17/18* (2013.01); *G06F 18/24* (2023.01)

(58) Field of Classification Search
CPC .......... G06F 17/18; G06F 18/24; G03F 7/705; G03F 7/70633; G01N 21/956
See application file for complete search history.

(56) References Cited

U.S. PATENT DOCUMENTS 4,282,510 A * 8/1981 Southgate .............. G06V 10/88
                                                     250/559.46
6,961,116 B2   11/2005 Den Boef et al.
(Continued)

FOREIGN PATENT DOCUMENTS

CN          105874387          8/2016
JP          2014512101         5/2014
(Continued)

OTHER PUBLICATIONS

International Search Report and Written Opinion issued in corresponding PCT Patent Application No. PCT/EP2018/085153, dated Mar. 25, 2019.

(Continued)

*Primary Examiner* — Deoram Persaud
(74) *Attorney, Agent, or Firm* — Pillsbury Winthrop Shaw Pittman, LLP

(57) ABSTRACT

A method for generating metrology sampling scheme for a patterning process, the method including: obtaining a parameter map of a parameter of a patterning process for a substrate; decomposing the parameter map to generate a fingerprint specific to an apparatus of the patterning process and/or a combination of apparatuses of the patterning process; and based on the fingerprint, generating a metrology sampling scheme for a subsequent substrate at the apparatus of the patterning process and/or the combination of apparatuses of the patterning process, wherein the sampling (Continued)

scheme is configured to distribute sampling points on the subsequent substrate so as to improve a metrology sampling density.

20 Claims, 19 Drawing Sheets

(56) References Cited

U.S. PATENT DOCUMENTS

| | | | |
|---|---|---|---|
| 7,587,704 | B2 | 9/2009 | Ye et al. |
| 11,067,902 | B2* | 7/2021 | Warnaar .................. G03F 7/705 |
| 11,221,560 | B2 | 1/2022 | Chen et al. |
| 2006/0066855 | A1 | 3/2006 | Boef et al. |
| 2008/0286885 | A1 | 11/2008 | Izikson et al. |
| 2009/0157360 | A1 | 6/2009 | Ye et al. |
| 2011/0027704 | A1 | 2/2011 | Cramer et al. |
| 2011/0043791 | A1 | 2/2011 | Smilde et al. |
| 2012/0029856 | A1 | 2/2012 | Cohen et al. |
| 2012/0242970 | A1 | 9/2012 | Smilde et al. |
| 2014/0037187 | A1 | 2/2014 | Marcuccilli et al. |
| 2015/0043803 | A1 | 2/2015 | Jeong |
| 2016/0371423 | A1 | 12/2016 | Vukkadala et al. |
| 2018/0067900 | A1 | 3/2018 | Mos et al. |
| 2019/0204750 | A1* | 7/2019 | Wang .................. G03F 7/70633 |
| 2019/0361358 | A1 | 11/2019 | Tel et al. |
| 2020/0371441 | A1* | 11/2020 | Tel ........................ G01N 21/956 |
| 2022/0026810 | A1* | 1/2022 | Brantjes .............. G03F 7/70491 |

FOREIGN PATENT DOCUMENTS

| | | |
|---|---|---|
| JP | 2015038474 | 2/2015 |
| JP | 2015527740 | 9/2015 |
| JP | 2017063827 | 4/2017 |
| KR | 20130095262 | 8/2013 |
| TW | 201245906 | 11/2012 |
| TW | 201740220 | 11/2017 |
| WO | 2009078708 | 6/2009 |
| WO | 2009106279 | 9/2009 |
| WO | 2016087069 | 6/2016 |
| WO | 2017194289 | 11/2017 |

OTHER PUBLICATIONS

Taiwanese Office Action issued in corresponding Taiwanese Patent Application No. 108101736, dated Mar. 10, 2020.
Research Disclosure: A fully automatic overlay/alignment sampling method to improve modeling efficiency, vol. 554, No. 17 (Jun. 1, 2010).
Office Action issued in corresponding Chinese Patent Application No. 201880088371.6, dated Jan. 18, 2023.
Office Action issued in corresponding Korean Patent Application No. 10-2022-7035021, dated Jan. 11, 2023.
Korean Notice of Allowance issued in corresponding Korean Patent Application No. 10-2020-7021488, dated Jul. 12, 2022.
Taiwanese Office Action issued in corresponding Taiwanese Patent Application No. 110122407, dated Oct. 14, 2021.
Korean Office Action issued in corresponding Korean Patent Application No. 10-2020-7021488, dated Dec. 27, 2021.
Taiwanese Office Action issued in corresponding Taiwanese Patent Application No. 109137183, dated Nov. 19, 2020.

* cited by examiner

COMPUTATIONAL METROLOGY BASED SAMPLING SCHEME

This application is a continuation of pending U.S. patent application Ser. No. 16/959,736, filed Jul. 2, 2020, which is the U.S. national phase entry of PCT patent application no. PCT/EP2018/085153, which was filed on Dec. 17, 2018, which claims the benefit of priority of European patent application no. 18153189.8 which was filed on Jan. 24, 2018 and of European patent application no. application 18189752.1 which was filed on Aug. 20, 2018, each of the foregoing applications is incorporated herein in its entirety by reference.

FIELD

The present disclosure relates to techniques of improving the performance of a device manufacturing process. The techniques may be used in connection with a lithographic apparatus or a metrology apparatus.

BACKGROUND

A lithography apparatus is a machine that applies a desired pattern onto a target portion of a substrate. Lithography apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithography apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing (CMP), and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

Each separate patterning process step may have its own specific impact on the quality of the obtained semiconductor devices across the processed substrates. Typically each patterning process step can be associated with a particular spatial fingerprint of properties of the semiconductor devices (for example an overlay error between two layers of the substrate at the location of a semiconductor device). When applying metrology to the processed substrates it is important that these spatial fingerprints are captured correctly in order to accurately determine whether individual patterning processing tools (such as CMP, etcher, lithography tools, etc.) are functioning according to expectation (e.g. their spatial fingerprints have not drifted or demonstrate unexpected properties).

SUMMARY

It is an objective of the invention to determine sampling schemes for performing metrology on process substrates which allow accurate determination of contributions of individual processing tools to a fingerprint of a parameter measured by a metrology tool.

In an embodiment a method for generating a metrology sampling scheme for a patterning process is disclosed, the method comprising: obtaining a parameter map of a parameter of a patterning process for a substrate; decomposing, by a hardware computer system, the parameter map to generate a fingerprint specific to an apparatus of the patterning process and/or a combination of apparatuses of the patterning process; and based on the fingerprint, generating, by the hardware computer system, a metrology sampling scheme for a subsequent substrate at the apparatus of the patterning process and/or the combination of apparatuses of the patterning process, wherein the sampling scheme is configured to distribute sampling points on the subsequent substrate so as to improve a metrology sampling density.

In an another embodiment a method for generating metrology sampling scheme for a patterning process is disclosed, the method comprising: obtaining data corresponding to a first sampling scheme for a substrate and/or an apparatus of a pattering process, and a parameter map corresponding to the obtained data; identifying, by a hardware computer system, a contributor of the parameter map; removing, by the hardware computer system, a contribution of the contributor from the parameter map to generate a residual map; and generating, by modelling and/or simulation, a second metrology sampling scheme based on the residual map, wherein the second metrology sampling scheme is configured to distribute sampling points on the subsequent substrate so as to improve a metrology sampling density

DETAILED DESCRIPTION

Before describing embodiments in detail, it is instructive to present an example environment in which embodiments may be implemented.

Figure 1:
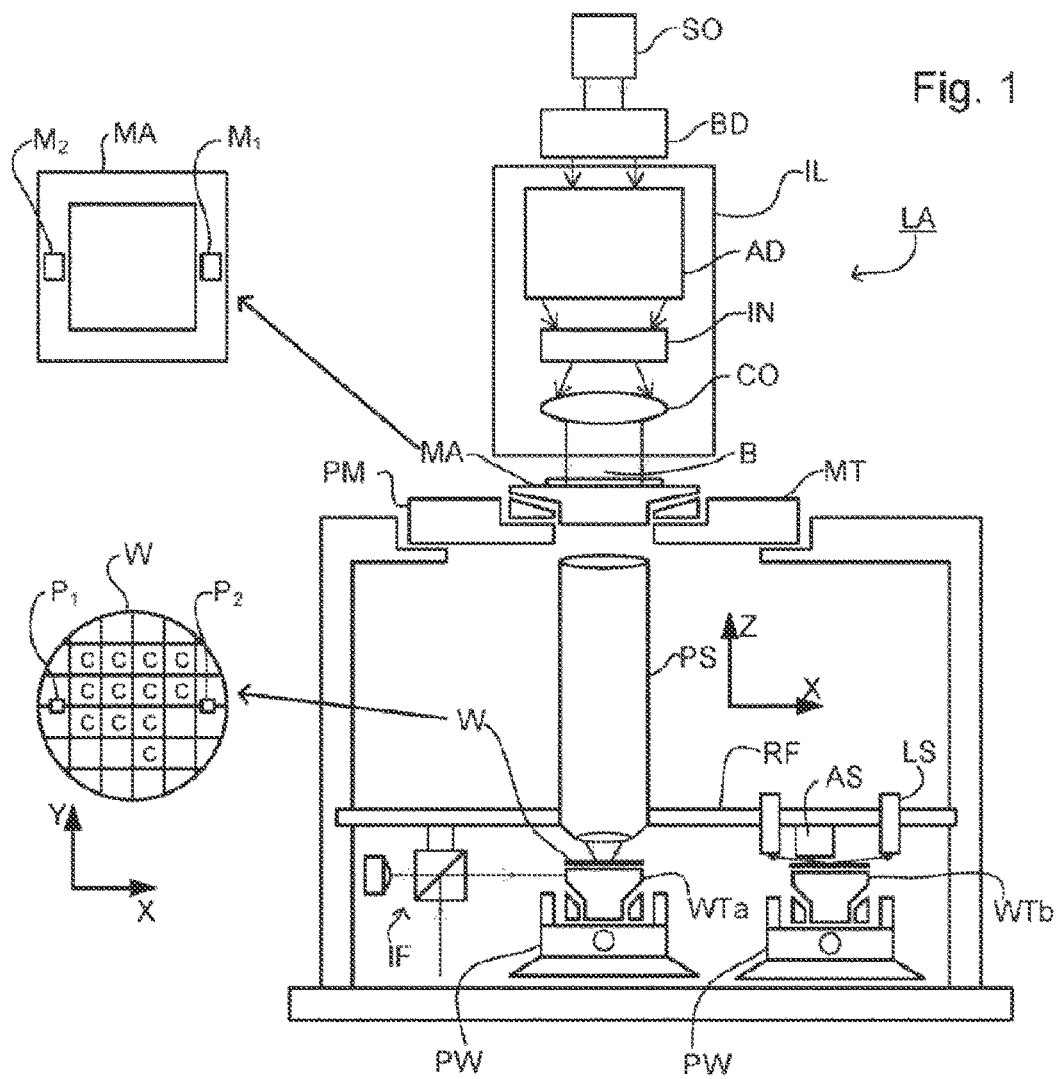
FIG. 1 schematically depicts a lithography apparatus according to an embodiment.

FIG. 1 schematically depicts an embodiment of a lithographic apparatus LA. The apparatus comprises:
- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT (e.g., WTa, WTb or both) constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies and often referred to as fields) of the substrate W, the projection system supported on a reference frame (RF).

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

So, the illuminator IL may comprise adjuster AM configured to adjust the (angular/spatial) intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable to alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation.

Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CODs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

So, in operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

Various patterns on or provided by a patterning device may have different process windows. i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein.

When controlling a part of a patterning process, it is possible and economical to focus on the hot spots. When the hot spots are not defective, it is most likely that all the patterns are not defective.

Figure 2:
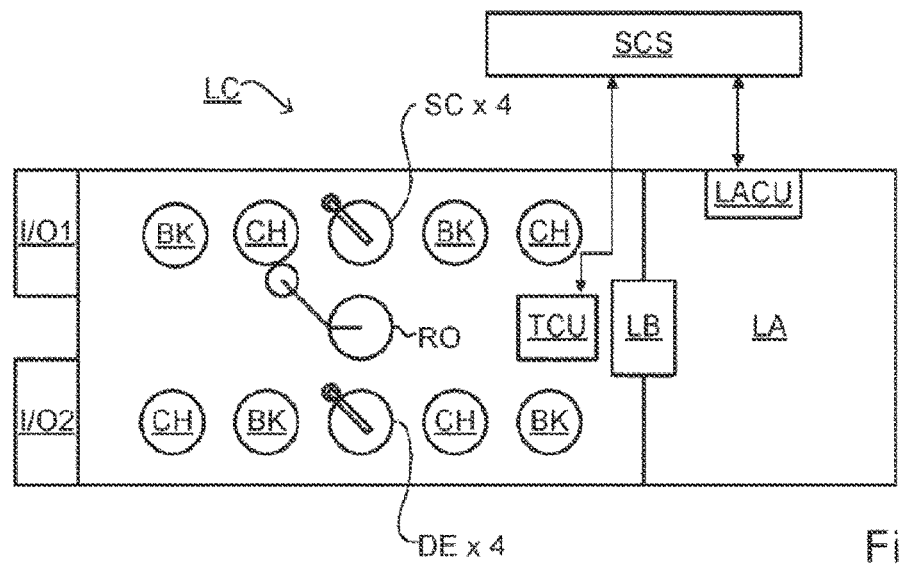
FIG. 2 schematically depicts an embodiment of a lithographic cell or cluster.

As shown in FIG. 2, the lithographic apparatus LA may form part of a lithographic cell LC, also sometimes referred to as a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently and/or in order to monitor a part of the patterning process (e.g., a device manufacturing process) that includes at least one pattern transfer step (e.g., an optical lithography step), it is desirable to inspect a substrate or other object to measure or determine one or more properties such as alignment, overlay (which can be, for example, between structures in overlying layers or between structures in a same layer that have been provided separately to the layer by, for example, a double patterning process), line thickness, critical dimension (CD), focus offset, a material property, etc. Accordingly a manufacturing facility in which lithocell LC is located also typically includes a metrology system MET which measures some or all of the substrates W that have been processed in the lithocell or other objects in the lithocell. The metrology system MET may be part of the lithocell LC, for example it may be part of the lithographic apparatus LA (such as alignment sensor AS).

The one or more measured parameters may include, for example, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on the substrate. The measurement can be performed after-development of a resist but before etching or can be performed after-etch.

There are various techniques for making measurements of the structures formed in the patterning process, including the use of a scanning electron microscope, an image-based measurement tool and/or various specialized tools. As discussed above, a fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. This may be termed diffraction-based metrology. One such application of this diffraction-based metrology is in the measurement of feature asymmetry within a target. This can be used as a measure of overlay, for example, but other applications are also known. For example, asymmetry can be measured by comparing opposite parts of the diffraction spectrum (for example, comparing the −1st and +1st orders in the diffraction spectrum of a periodic grating). This can be done as described above and as described, for example, in U.S. patent application publication US 2006-066855, which is incorporated herein in its entirety by reference. Another application of diffraction-based metrology is in the measurement of feature width (CD) within a target. Such techniques can use the apparatus and methods described hereafter.

Thus, in a device fabrication process (e.g., a patterning process or a lithography process), a substrate or other objects may be subjected to various types of measurement during or after the process. The measurement may determine whether a particular substrate is defective, may establish adjustments to the process and apparatuses used in the process (e.g., aligning two layers on the substrate or aligning the patterning device to the substrate), may measure the performance of the process and the apparatuses, or may be for other purposes. Examples of measurement include optical imaging (e.g., optical microscope), non-imaging optical measurement (e.g., measurement based on diffraction such as ASML YieldStar metrology tool, ASML SMASH metrology system), mechanical measurement (e.g., profiling using a stylus, atomic force microscopy (AFM)), and/or non-optical imaging (e.g., scanning electron microscopy (SEM)). The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, a metrology apparatus is used to determine one or more properties of the substrate, and in particular, how one or more properties of different substrates vary or different layers of the same substrate vary from layer to layer. As noted above, the metrology apparatus may be integrated into the lithographic apparatus LA or the lithocell LC or may be a stand-alone device.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT), a Bit Line Contact (BLC), etc. structure).

In an embodiment, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars or vias may alternatively be etched into the substrate (e.g., into one or more layers on the substrate).

In an embodiment, one of the parameters of interest of a patterning process is overlay. Overlay can be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by device product structures on a substrate. In an embodiment, multiple targets can be measured in one radiation capture.

Figure 3:
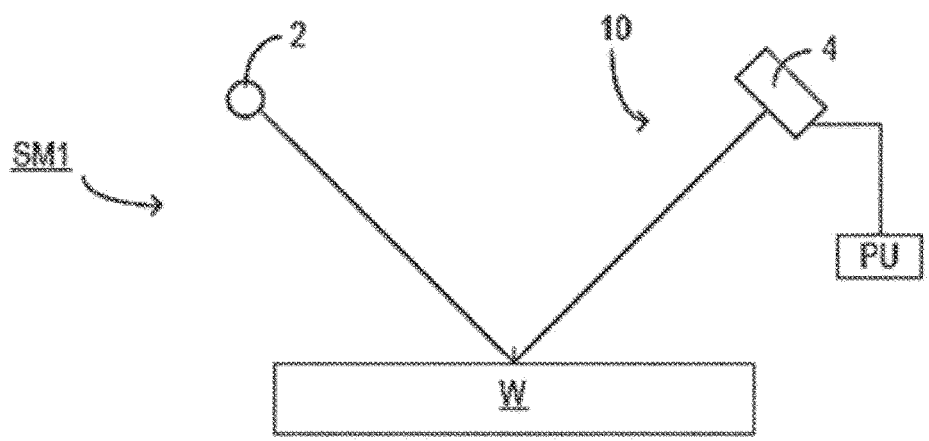
FIG. 3 schematically depicts an example inspection apparatus and metrology technique.
Figure 3:
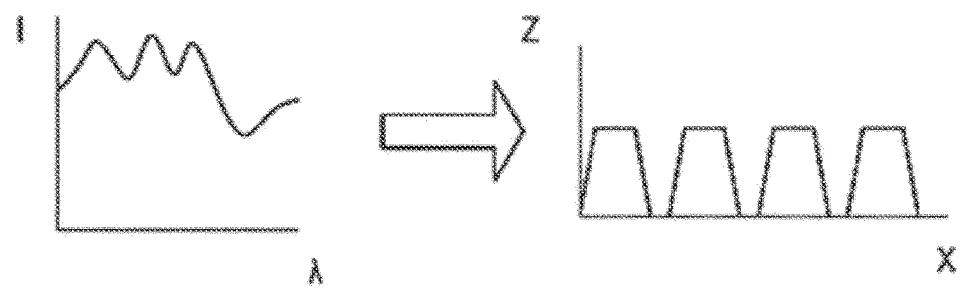

FIG. 3 depicts an example inspection apparatus (e.g., a scatterometer). It comprises a broadband (white light) radiation projector 2 which projects radiation onto a substrate W. The redirected radiation is passed to a spectrometer detector 4, which measures a spectrum 10 (intensity as a function of wavelength) of the specular reflected radiation, as shown, e.g., in the graph in the lower left. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 3. In general, for the reconstruction the general form of the structure is known and some variables are assumed from knowledge of the process by which the structure was made, leaving only a few variables of the structure to be determined from the measured data. Such an inspection apparatus may be configured as a normal-incidence inspection apparatus or an oblique-incidence inspection apparatus.

Figure 4:
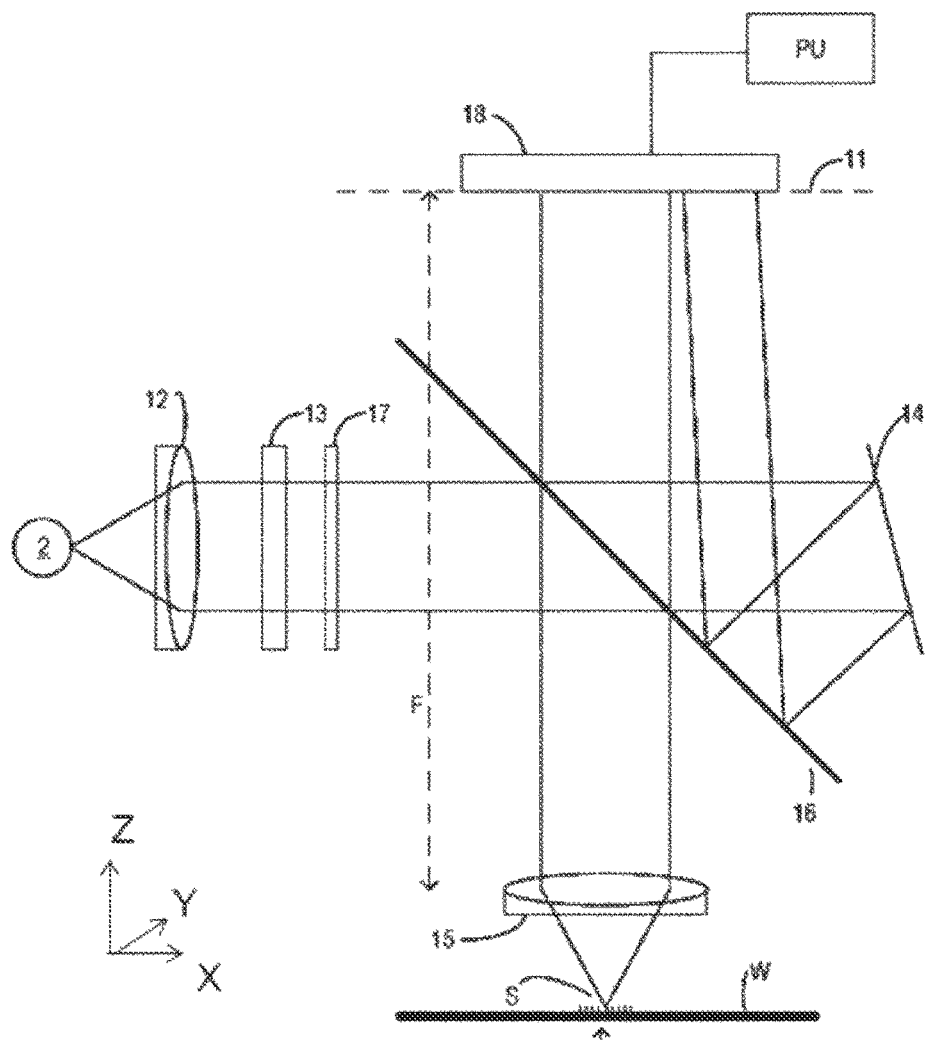
FIG. 4 schematically depicts an example inspection apparatus.

Another inspection apparatus that may be used is shown in FIG. 4. In this device, the radiation emitted by radiation source 2 is collimated using lens system 12 and transmitted through interference filter 13 and polarizer 17, reflected by partially reflecting surface 16 and is focused into a spot S on substrate W via an objective lens 15, which has a high numerical aperture (NA), desirably at least 0.9 or at least 0.95. An immersion inspection apparatus (using a relatively high refractive index fluid such as water) may even have a numerical aperture over 1.

As in the lithographic apparatus LA, one or more substrate tables may be provided to hold the substrate W during measurement operations. The substrate tables may be similar or identical in form to the substrate table WT of FIG. 1. In an example where the inspection apparatus is integrated with the lithographic apparatus, they may even be the same substrate table. Coarse and fine positioners may be provided to a second positioner PW configured to accurately position the substrate in relation to a measurement optical system. Various sensors and actuators are provided, for example to acquire the position of a target of interest, and to bring it into position under the objective lens 15. Typically many measurements will be made on targets at different locations across the substrate W. The substrate support can be moved in X and Y directions to acquire different targets, and in the Z direction to obtain a desired location of the target relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and only the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

The radiation redirected by the substrate W then passes through partially reflecting surface 16 into a detector 18 in order to have the spectrum detected. The detector 18 may be located at a back-projected focal plane 11 (i.e., at the focal length of the lens system 15) or the plane 11 may be re-imaged with auxiliary optics (not shown) onto the detector 18. The detector may be a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam may be used, for example, to measure the intensity of the incident radiation. To do this, when the radiation beam is incident on the partially reflecting surface 16 part of it is transmitted through the partially reflecting surface 16 as a reference beam towards a reference mirror 14. The reference beam is then projected onto a different part of the same detector 18 or alternatively on to a different detector (not shown).

One or more interference filters 13 are available to select a wavelength of interest in the range of, say, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 18 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may be etched into or on the substrate (e.g., into one or more layers on the substrate). The pattern (e.g., of bars, pillars or vias) is sensitive to change in processing in the patterning process (e.g., optical aberration in the lithographic projection apparatus (particularly the projection system PS), focus change, dose change, etc.) and will manifest in a variation in the printed grating. Accordingly, the measured data of the printed grating is used to reconstruct the grating. One or more parameters of the 1-D grating, such as line width and/or shape, or one or more parameters of the 2-D grating, such as pillar or via width or length or shape, may be input to the reconstruction process, performed by processor PU, from knowledge of the printing step and/or other inspection processes.

In addition to measurement of a parameter by reconstruction, angle resolved scatterometry is useful in the measurement of asymmetry of features in product and/or resist patterns. A particular application of asymmetry measurement is for the measurement of overlay, where the target 30 comprises one set of periodic features superimposed on another. The concepts of asymmetry measurement using the instrument of FIG. 3 or FIG. 4 are described, for example, in U.S. patent application publication US2006-066855, which is incorporated herein in its entirety. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 4, where detector 18 may be an image sensor, such asymmetry in the diffraction orders appears directly as asymmetry in the pupil image recorded by detector 18. This asymmetry can be measured by digital image processing in unit PU, and calibrated against known values of overlay.

Figure 5:
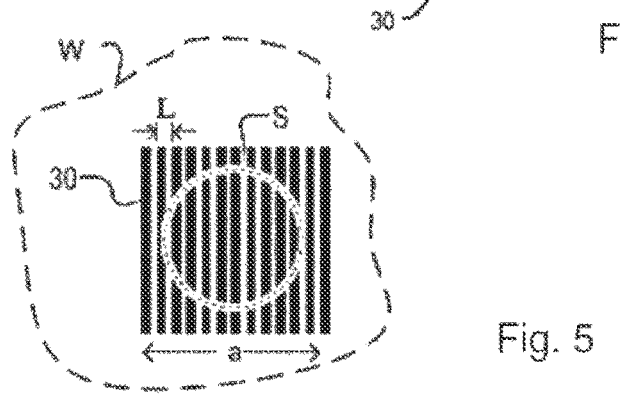
FIG. 5 illustrates the relationship between an illumination spot of an inspection apparatus and a metrology target.

FIG. 5 illustrates a plan view of a typical target 30, and the extent of illumination spot S in the apparatus of FIG. 4. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 12, 13, 17 may be configured to provide illumination of a uniform intensity across a back focal plane of objective 15. Alternatively, by, e.g., including an aperture in the illumination path, illumination may be restricted to on axis or off axis directions.

Figure 6:
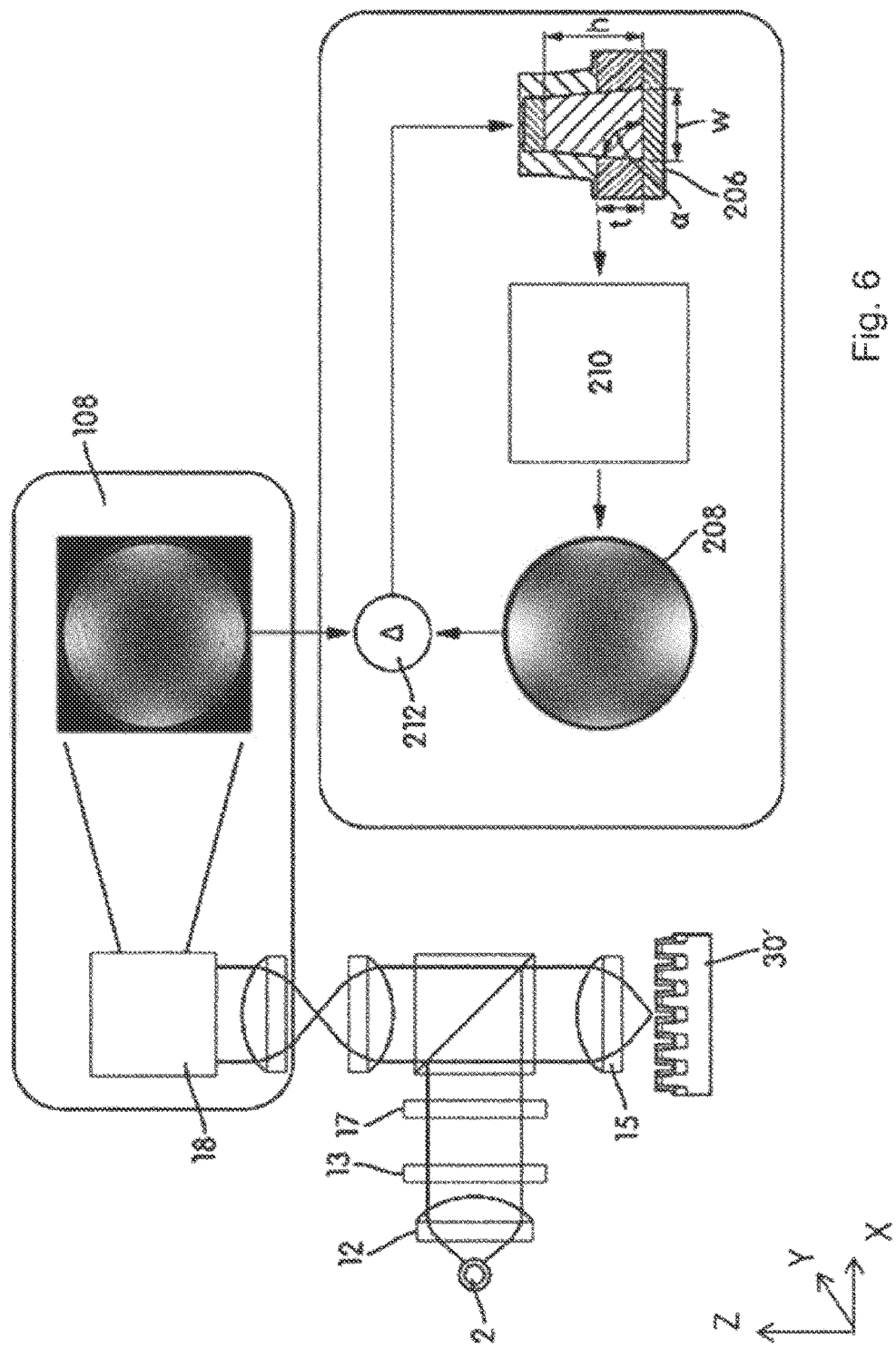
FIG. 6 schematically depicts a process of deriving a plurality of variables of interest based on measurement data.

FIG. 6 schematically depicts an example process of the determination of the value of one or more variables of interest of a target pattern 30' based on measurement data obtained using metrology. Radiation detected by the detector 18 provides a measured radiation distribution 108 for target 30'.

For a given target 30', a radiation distribution 208 can be computed/simulated from a parameterized model 206 using, for example, a numerical Maxwell solver 210. The parameterized model 206 shows example layers of various materials making up, and associated with, the target. The parameterized model 206 may include one or more variables for the features and layers of the portion of the target under consideration, which may be varied and derived. As shown in FIG. 6, the one or more of the variables may include the thickness t of one or more layers, a width w (e.g., CD) of one or more features, a height h of one or more features, and/or a sidewall angle α of one or more features. Although not shown, the one or more of the variables may further include, but is not limited to, the refractive index (e.g., a real or complex refractive index, refractive index tensor, etc.) of one or more of the layers, the extinction coefficient of one or more layers, the absorption of one or more layers, resist loss during development, a footing of one or more features, and/or line edge roughness of one or more features. The initial values of the variables may be those expected for the target being measured. The measured radiation distribution 108 is then compared at 212 to the computed radiation distribution 208 to determine the difference between the two. If there is a difference, the values of one or more of the variables of the parameterized model 206 may be varied, a new computed radiation distribution 208 calculated and compared against the measured radiation distribution 108 until there is sufficient match between the measured radiation distribution 108 and the computed radiation distribution 208. At that point, the values of the variables of the parameterized model 206 provide a good or best match of the geometry of the actual target 30'. In an embodiment, there is sufficient match when a difference between the measured radiation distribution 108 and the computed radiation distribution 208 is within a tolerance threshold.

Figure 7:
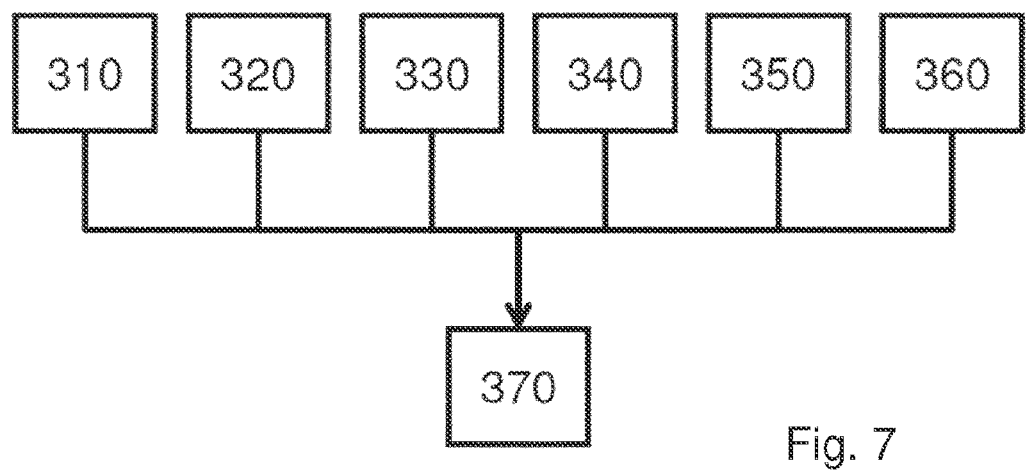
FIG. 7 shows example categories of processing variables.

Variables of a patterning process are called "processing variables." The patterning process may include processes upstream and downstream to the actual transfer of the pattern in a lithography apparatus. FIG. 7 shows example categories of the processing variables 370. The first category may be variables 310 of the lithography apparatus or any other apparatuses used in the lithography process. Examples of this category include variables of the illumination, projection system, substrate stage, etc. of a lithography apparatus. The second category may be variables 320 of one or more procedures performed in the patterning process. Examples of this category include focus control or focus measurement, dose control or dose measurement, bandwidth, exposure duration, development temperature, chemical composition used in development, etc. The third category may be variables 330 of the design layout and its implementation in, or using, a patterning device. Examples of this category may include shapes and/or locations of assist features, adjustments applied by a resolution enhancement technique (RET), CD of mask features, etc. The fourth category may be variables 340 of the substrate. Examples include characteristics of structures under a resist layer, chemical composition and/or physical dimension of the resist layer, etc. The fifth category may be characteristics 350 of temporal variation of one or more variables of the patterning process. Examples of this category include a characteristic of high frequency stage movement (e.g., frequency, amplitude, etc.), high frequency laser bandwidth change (e.g., frequency, amplitude, etc.) and/or high frequency laser wavelength change. These high frequency changes or movements are those above the response time of mechanisms to adjust the underlying variables (e.g., stage position, laser intensity). The sixth category may be characteristics 360 of processes upstream of, or downstream to, pattern transfer in a lithographic apparatus, such as spin coating, post-exposure bake (PEB), development, etching, deposition, doping and/or packaging.

As will be appreciated, many, if not all of these variables, will have an effect on a parameter of the patterning process and often a parameter of interest. Non-limiting examples of parameters of the patterning process may include critical dimension (CD), critical dimension uniformity (CDU), focus, overlay, edge position or placement, sidewall angle, pattern shift, etc. Often, these parameters express an error from a nominal value (e.g., a design value, an average value, etc.). The parameter values may be the values of a characteristic of individual patterns or a statistic (e.g., average, variance, etc.) of the characteristic of a group of patterns.

The values of some or all of the processing variables, or a parameter related thereto, may be determined by a suitable method. For example, the values may be determined from data obtained with various metrology tools (e.g., a substrate metrology tool). The values may be obtained from various sensors or systems of an apparatus in the patterning process (e.g., a sensor, such as a leveling sensor or alignment sensor, of a lithography apparatus, a control system (e.g., a substrate or patterning device table control system) of a lithography apparatus, a sensor in a track tool, etc.). The values may be from an operator of the patterning process.

Now, increasingly metrology has become a burden mostly in terms of time taken. This is, for example, particularly the case in the advent of multiple patterning techniques in the semiconductor industry. With multiple patterning techniques such as litho-etch-litho-etch (LELE) and/or sidewall assisted double patterning (SADP), the number of processing steps has increased significantly and therefore, so has the amount of metrology steps used for control and yield monitoring. Moreover, the amount of metrology increases for each node (i.e., reduction in feature size) as more layers are used in multiple patterning steps, and more patterning steps are used per layer.

Additionally or alternatively, there is an increased desire for defect determination and/or guided defect inspection. This involves substantially denser focus, overlay, and/or CD metrology than before.

Additionally or alternatively, there are ever tightening specifications on on-device CD, overlay, and/or focus performance. This drives manufacturing equipment specifications of, e.g., exposure tools and processing tools (e.g., deposition, etch, track, chemical mechanical polishing (CMP), etc.), from one node to the next. So, this drives tighter control and monitoring of performance which in turn drives the demand for ever increasing amounts of metrology for control and monitoring.

Additionally or alternatively, in line with tightening of the specifications on on-device CD, focus, and/or overlay performance, higher order corrections may be needed. A higher order correction is essentially a corrective action which is selective on a small spatial scale across all or part of the substrate (e.g. correction with a high spatial resolution). Higher order correction involves a denser sampling per substrate for metrology, thereby increasing the metrology burden perhaps beyond practical limits of metrology equipment productivity.

Additionally or alternatively, substrate to substrate variation may require further individual substrate level control (compared to, e.g., lot level control) and associated monitoring in order to achieve the desired CD, focus, and/or overlay performance. This may lead to measuring more substrates per lot and thus drive an increase in the amount of measurements used, perhaps beyond practical limits of metrology equipment productivity.

But, in order to meet the increased data demands, only adding metrology equipment or increasing metrology equipment productivity may not suffice. Moreover, it may not solve all problems such as obtaining dense CD, focus and/or overlay profiles across a substrate in a timely manner.

So, metrology efficiency is desirable. This is to obtain, e.g., higher density of data per substrate and data for a higher number of substrates per lot.

Therefore, in an embodiment, there is provided a method to, e.g., help improve metrology efficiency. In the method, metrology data from multiple sources is combined and manipulated in order to derive accurate estimated values of one or more patterning process parameters (e.g., CD, focus, overlay, edge placement, etc.) for each of a plurality of locations across a substrate. In an embodiment, then, there is provided dense metrology data (e.g., for each square mm) for, e.g., all of the substrates processed in a patterning process and for, e.g., all of the layers processed on such substrates in the patterning process.

In effect, in an embodiment, the results of the method is a "virtual" or emulated distribution of values of one or more patterning process parameters across the substrate, which is achieved through such combination of various metrology data. This method can offer then an efficient method for hybrid metrology for one or more patterning process parameters (e.g., focus, CD, overlay, etc.). And, while embodiments herein will consider primarily particular examples of patterning process parameters namely focus, CD and overlay, it will appreciated that one or more other or additional patterning process parameters can be the subject of the techniques herein.

As noted above, the method involves combination of metrology and other data from various sources. In an embodiment, the method involves combining measurements of a patterning process parameter of interest with data from one or more devices in the patterning process, such as data from one or more sensors of the lithographic apparatus. This combination of data will then be used to predict on-product performance in the form of, e.g., a patterning process parameter, such as CD, overlay, focus, pattern shift, edge placement (e.g., edge placement error), etc. and/or a parameter derived therefrom, such as yield, defects (e.g., risk of defect, defect counts, etc.), etc.

Thus, a principle underlying the method is to isolate and estimate individual root-causes of the change of a patterning process parameter of interest which are then combined to compute the on-product performance. The goal is to use as much of the available information as possible to avoid ever increasing amounts of off-line (and/or on-line) metrology to determine a patterning process parameter of interest using tools such as described in respect of FIGS. 3-6.

Thus, in an embodiment, it is desirable to identify the various contributions to the change of a patterning process parameter of interest (such as CD error, focus error, overlay, etc.). Those contributions can then be used in various combinations to achieve a desired estimate of the on-product performance. Typically, those contributions will be an error and/or a residual. For example, a device may produce an error in making a correction, which can then realize a change of the patterning process parameter of interest. As another example, a sensor system may measure an error, which error is or contributes to a change of the patterning process parameter. As a further example, a device or a mathematical model used to determine a setting of the device may not be able to realize a certain desired or best physical effect (e.g., a difference between a desired physical correction and the physical correction that can be achieved by a device, a difference between a desired physical effect such as dose, focus, etc. and the physical effect than can be achieved by a device, a difference between a desired physical correction or effect and the correction or effect capable of being determined by a mathematical model, etc.) and thus realize a residual that is or contributes to a change of the patterning process parameter. In an embodiment, a contribution can be determined experimentally or empirically.

Each of these contributions to a patterning process parameter of interest as spatially distributed across a die, a field or a substrate can then be characterized as a fingerprint. And, similarly, the combined contributions across the die, the field or the substrate can be characterized as a fingerprint.

So, a plurality of these contributions can be combined to yield a derived fingerprint. For example, a focus fingerprint on a product substrate can be, for instance, a composite of focus contributions due to unflatness of that substrate, a focus error associated with the projection system of the lithographic apparatus during the substrate's exposure, a height error made by the substrate position control loop during exposure, and a residual fingerprint of the focus setup of the lithographic apparatus. An example of this is described below in respect of FIG. 9.

Figure 10:
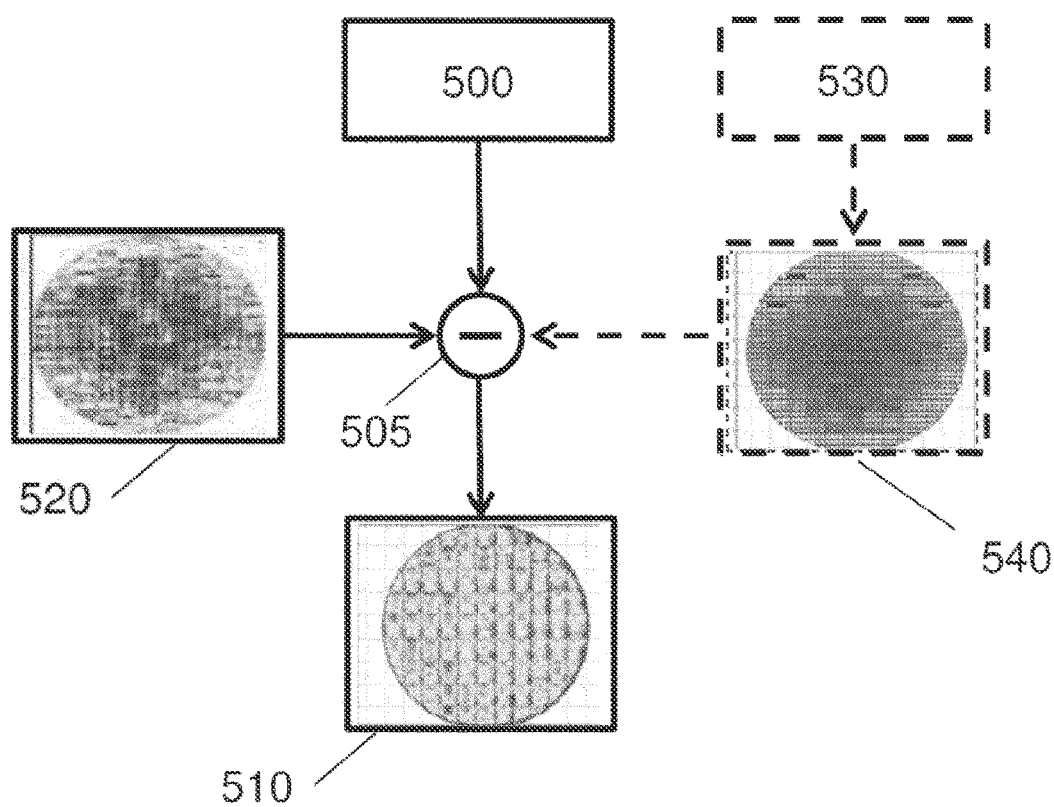
FIG. 10 schematically shows an example of deriving a contribution to a processing variable from metrology data.

Similarly, a derived or measured fingerprint can have one or more fingerprints removed therefrom to yield a (further) derived fingerprint. For example, a measured focus fingerprint of a substrate can have removed therefrom the focus contributions of unflatness of that substrate, a focus error associated with the projection system of the lithographic apparatus during the substrate's exposure, a height error made by the substrate position control loop during exposure, and a residual fingerprint of the focus setup of the lithographic apparatus. This can yield a residual focus fingerprint due to errors not captured by the removed fingerprints. An example of this is described below in respect of FIG. 10.

Thus, in an embodiment, the method can, for example, break down a fingerprint into individual contribution fingerprints and/or derive a fingerprint by combining fingerprints.

Figure 8:
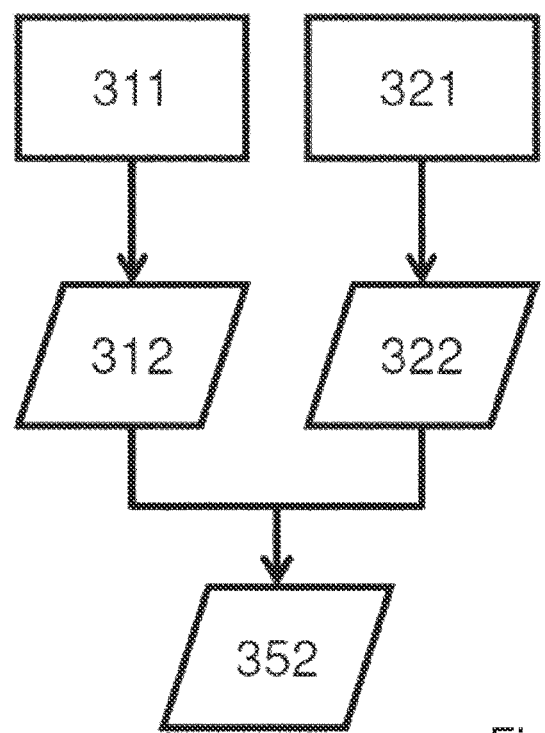
FIG. 8 schematically shows that changes of processing variables may have contributions to metrology data.

So, referring to FIG. 8, an embodiment of the combination of contributions (fingerprints) is depicted. A change of a processing variable 311 (e.g., in the focus context, a height error) may have a contribution 312 to a patterning process parameter 352 (e.g., in the context of focus, focus) for a pattern on a substrate and that a change of a processing variable 321 (e.g. in the focus context, a residual of the focus setup) may have a contribution 322 to the patterning process parameter 352. Namely, the patterning process parameter 352 may have combined contributions of changes of one or more processing variables. These contributions 312 and 322 may be simply additive (which may include weighted or linear addition) or be combined by other functions (e.g., using (de)convolution, using a neural network, RMS addition, scaling, etc.). The patterning process parameter 352 may have contributions of changes in other variables. So, with this realization as discussed further hereafter, various contributions can be determined or can be used to derive estimates of a patterning process parameter. In an embodiment, the contribution 312 and/or 322 may be determined by modeling the one or more applicable processing variables. The contribution 312 and/or 322 may be expressed as a function of the one or more applicable processing variables. The function may be linear or non-linear.

Figure 9:
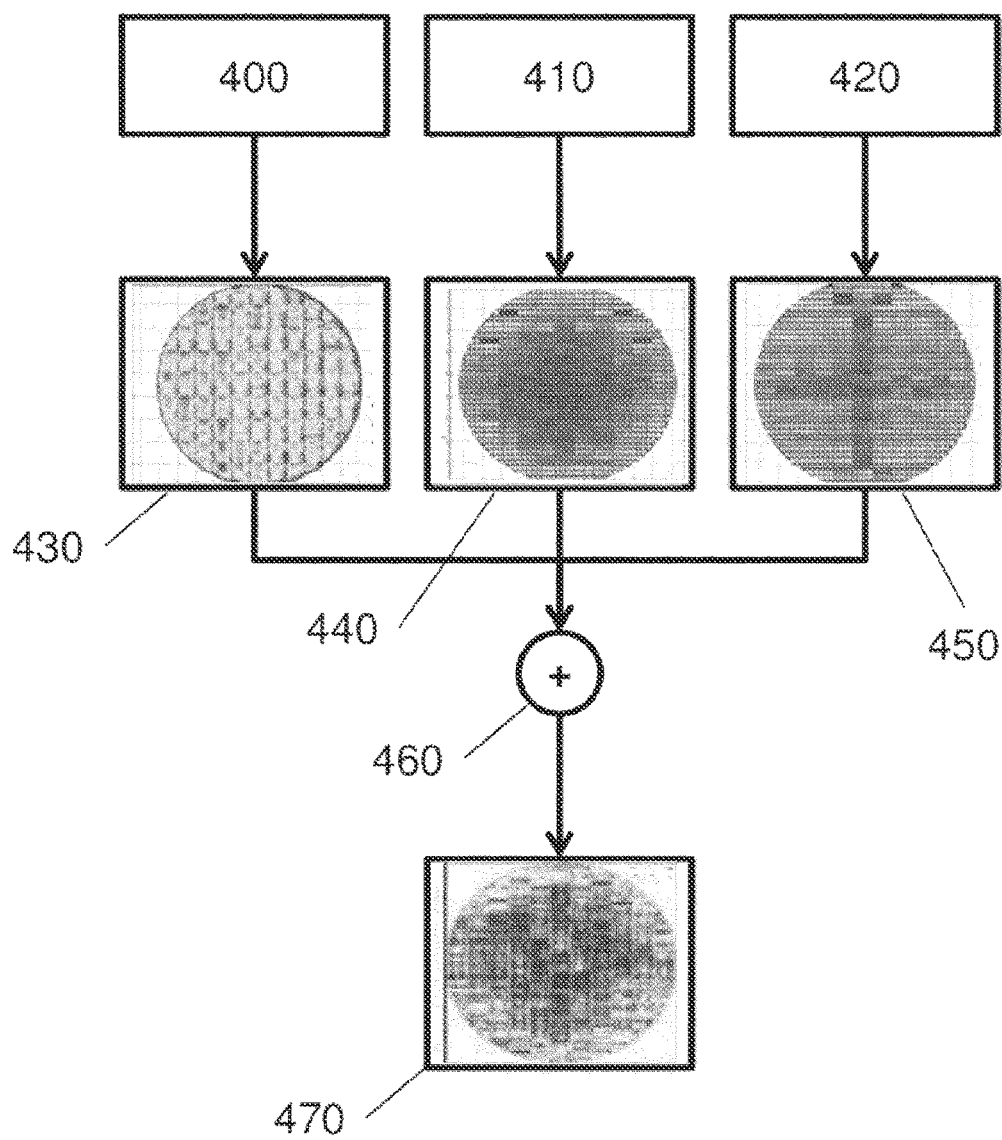
FIG. 9 schematically shows an example of deriving a combined contribution to a processing variable.

FIG. 9 schematically shows an example of obtaining a derived contribution 470 to a patterning process parameter of a substrate, the derived contribution being a combination of contributions (one or more of which may be a derived contribution) of multiple processing variables. In this case, the derived contribution 470 is (de)focus. So, the derived contribution 470 can be obtained using contributions of multiple processing variables such as focus error (FE) associated with the projection system of the lithographic apparatus during the substrate's exposure 400, a height error (e.g., moving standard deviation ($MSD_z$)) made by the substrate position control loop during exposure 410, and unflatness (P) of that substrate 420. Significantly, this data can be obtained from the lithographic apparatus and can be a by-product of producing a substrate as part of a patterning process. None of these identified contributions necessarily requires a measurement of a feature patterned on the substrate using, for example, tools such as described in respect of FIGS. 3-6.

So, in the focus case, an example of the contribution to focus of processing variable 400 is shown as contribution 430, an example of the contribution to focus of processing variable 410 is shown as contribution 440, and an example of the contribution to focus of processing variable 420 is shown as contribution 440. Each of these contributions is then combined together 460 to realize derived contribution 470. While element 460 (and other elements in the Figures) shows a plus sign, the operation at 460 need not be addition, e.g., it can be a multiplication, convolution, through use of a neural network etc. The operation may be different for one or more contributions than another one or more contributions (e.g., an addition of 430 to 440 and a convolution of the sum with contribution 450). In an example, the combined contribution can be expressed as $F(x,y)=a_1*F(FE)(x,y)+b_1*F(MSD_z)(x,y)+c_1*F(P)(x,y)+\ldots$. The various functions can be obtained by simulation, mathematical modeling and/or experimentation. Moreover, there may be cross terms that are not shown here (such as focus as a function of FE times MSD, etc.). To obtain an absolute value of focus, a nominal value or simulated value of the focus can be combined with the contributions. The coefficients such as $a_1$, $b_1$, $c_1$ are sensitivities of the focus with respect to the respective processing variables or their functions. In this example, the contributions are across a substrate but in an embodiment, one or more of the contributions may per die/field (which could then be repeated across the substrate depending on, e.g., applicable conditions at each of the instances). As noted above, the contribution 470 may be characterized as a fingerprint since it can be spatially defined across the substrate/die/field. Further, the contribution's translation into an absolute value may be characterized as a fingerprint since it can be spatially defined across the substrate/die/field. As will be appreciated, data from processing of multiple substrates using the patterning process can be used to derive the respective contributions. This data can already be available since it could be the by-product of processing the substrates.

Now, in the context of CD, the same technique described in respect of FIG. 9 can be used. For example, the derived contribution 470 to CD can be the combination of contributions (which can include a derived contribution) attributable to multiple processing variables such as focus (F) 400, moving standard deviation ($MSD_z$) 410 of movement of the substrate in the normal direction of the substrate, and moving standard deviation ($MSD_x$) 420 of movement of the substrate in a direction parallel to the substrate. So, in this case, an example of the contribution to CD of focus (F) 400 would be contribution 430, an example of the contribution to CD of moving standard deviation ($MSD_z$) 410 would be contribution 440, and an example of the contribution to CD of moving standard deviation ($MSD_x$) 420 would be contribution 440. Each of these contributions is then combined together 460 to realize derived contribution 470. In an example, the combined contribution can be expressed as $CD(x,y)=a_1*CD(F^2)(x,y)+b_1*CD(MSD_x)(x,y)+c_1*CD(MSD_z^2)(x,y)+\ldots$. Moreover, there may be cross terms that are not shown here and the relations may be different (e.g., a relation, such as focus and/or MSDz, may not be purely quadratic, and could have linear and 3rd order terms). In an embodiment, the contributions 430, 440, 450 may be respectively focus (F) 400, moving standard deviation ($MSD_z$) 410 and moving standard deviation ($MSD_x$) 420 distributions in which case a CD model would be used to combine them into a CD distribution. Moreover, there may be cross terms that are not shown here (such as CD as a function of F times MSD, etc.). To obtain an absolute value of CD, a nominal value or simulated value of the CD can be combined with the contributions. The coefficients such as $a_1$, $b_1$, $c_1$ are sensitivities of the CD with respect to the processing variables or their functions.

Applying the principles described above, FIG. 10 schematically shows an example of obtaining a derived contribution 510 from patterned substrate metrology data for a patterning process parameter of interest of a substrate by removing a contribution to the patterning process parameter of interest. Patterned substrate metrology data in this context are values of a parameter of interest obtained by measuring a feature (e.g., a device pattern feature, a metrology target separate from the device pattern, etc.) on substrate that is at least partially processed by the patterning process. Such metrology data can typically be obtained using metrology or inspection tools such as described in respect of FIGS. 3-6.

Patterned substrate metrology data 500 for a parameter of interest may have at least two contributions. So, one or more contributions within the patterned substrate metrology data can be obtained by removing one or more other contributions within the patterned substrate metrology data. Thus, a contribution 510 may be obtained by removing 505 a contribution 520 from the patterned substrate metrology data 500. While element 505 (and other elements in the Figures) shows a minus sign, the operation at 505 need not be subtraction, e.g., it can be a multiplication, (de)convolution, through use of a neural network, etc. Contribution 520 can be a derived contribution, such as contribution 470, or can be a contribution derived from other data, such as any one or more of contributions 430, 440 and 450. Further, multiple contributions can be removed. For example, optional contribution 540, associated with a processing variable 530, can be removed from the patterned substrate metrology data 500 along with contribution 520. As will be appreciated, data from processing of multiple substrates using the patterning process can be used to obtain the patterned substrate metrology data.

In an embodiment, the patterned substrate metrology data is from a pattern separate from a device pattern, for example a metrology feature of at a non-functional area of a die, between dies or on a test substrate. So, for example, the contribution of one or more processing variables can be removed from such metrology data, thereby obtaining a remaining contribution of one or more processing variables to such metrology data. The comparable contribution to metrology data of a device pattern on the same or different substrate can then be obtained based on the remaining contribution, without the need of actually obtaining the metrology data from the device pattern. For example, the contribution to the metrology of the device pattern may be estimated to be the same as the remaining contribution because the applicable one or more processing variables have comparable effect to the device pattern and the separate pattern. In an embodiment, the separate pattern is a pattern for testing purpose (e.g., a metrology target) and performing metrology on the separate pattern does not impact a device pattern on the substrate.

Therefore, by combining contributions and/or removing contributions from patterned substrate metrology data, estimates of a parameter of interest of a substrate can be obtained without necessarily having to obtain patterned substrate metrology data for that substrate. This is done by recognizing the nature of the various contributions.

In an embodiment, a contribution of one or more processing variables may be apparatus (e.g., lithographic apparatus) specific; that is, the contribution is specific to a certain actual apparatus or combination of apparatuses. Thus, in an embodiment, the contribution of the one or more processing variables may be used repeatedly across every substrate. Therefore, the contribution of one or more processing variables may be pre-characterized and obtained from a database for various combination/removal processes. The contribution may be apparatus specific as a whole or a specific part (e.g., etch chamber) of the apparatus. Examples of such variables may include, but are not limited to, various characteristics of a process upstream or downstream to pattern transfer in the lithographic apparatus, such as spin coating, post exposure bake, development, etching, deposition, doping, and/or packaging.

In an embodiment, a contribution of one or more processing variables is not specific to a particular substrate (and so can be used across substrates). Thus, the contribution of one or more processing variables may be pre-characterized and obtained from a database later for various combination/removal processes. This contribution of one or more processing variables can be applied to a specific substrate by combining it with data of the one or more variables for the specific substrate and a sensitivity relationship. Examples of such variables may include, but is not limited to, variables of the illumination, projection system, focus, dose, bandwidth, exposure duration, a characteristic of high frequency stage movement (e.g., moving standard deviation (MSD) of movement of the substrate stage, moving average of the movement of the substrate stage, frequency, amplitude, etc.), a high frequency laser bandwidth change (e.g., frequency, amplitude, etc.), a high frequency laser wavelength change, and/or flatness of the substrate.

In an embodiment, the contribution of one or more processing variables may be substrate specific. For example, the contribution may be determined for each substrate or a specific group of substrates. Examples of such variables may include, but are not limited to, substrate geometry (height map, deformation map), substrate processing conditions, variables of the illumination, variables of the projection system, focus, dose, bandwidth, exposure duration, a characteristic of high frequency stage movement (e.g., moving standard deviation (MSD) of movement of the substrate stage, moving average of the movement of the substrate stage, etc.), a high frequency laser bandwidth change (e.g., frequency, amplitude, etc.), a high frequency laser wavelength change, and/or flatness of the substrate.

In an embodiment, the contribution of one or more processing variables may be pattern or patterning device specific; that is, the contribution is specific to a certain actual patterning device or specific pattern to be provided by a patterning device. This contribution can be further substrate independent. Thus, the pattern or patterning device specific contribution may be pre-characterized and obtained from a database later for various combination processes. Examples of such variables may include, but are not limited to, patterning device feature CD, a shape and/or location of an assist feature, an adjustment applied by a resolution enhancement technique (RET), etc.

In an embodiment, the contribution associated with different processing variables may have different spatial uniformity. For example, the contribution of some processing variables may be essentially spatially uniform across the entire substrate, while the contribution of some other processing variables may be not so spatially uniform across the entire substrate. This difference may be attributed to the different nature of the processing variables. For example, the contribution of one or more processing variables associated with the resist layer, development of the resist layer, and/or etching of the substrate tend to be essentially spatially uniform because the entire substrate is usually coated with the resist layer, developed or etched at a same time and under a same condition, or tends to be symmetric because of, for example, rotation of the substrate during a number of these processes. For example, the contribution of one or more processing variables associated with the pattern transfer or the lithography apparatus tends to be less spatially uniform because the pattern transfer tends to be location specific and the one or more processing variables may change between pattern transfer for one location and pattern transfer for another location. Therefore, if the contribution that is not essentially spatially uniform can be removed from patterned substrate metrology data, an essentially spatially uniform contribution can be obtained from the patterned substrate metrology data.

So, in a specific example, processing variable data can be gathered from the lithographic apparatus for each point exposed on the substrate, such as leveling information, moving average (MA) of movement of the substrate, MSDxyz, dose, laser bandwidth, pupil shape, etc. This data is typically already available in a lithographic apparatus, e.g., in diagnostic files. From this data, the contribution described above can be generated using a model for the parameter of interest that describes the sensitivity of the parameter of interest to the one or more processing variables. The one or more sensitivities can be obtained from simulation or from experiments. The contribution generated in this fashion is what would be expected to be seen during a measurement after resist development, assuming the track and resist model calibration would be perfect. Once the substrate is measured, e.g., after develop or after etch, the contribution is removed from patterned substrate metrology data. The remaining contribution is now the contribution by the pre- or post-pattern transfer process (e.g., by the track and/or etch apparatus, which is generally interfield) and the patterning device (intrafield). The lithographic apparatus errors would have been corrected from the patterned substrate metrology data. Similarly, the patterning device contribution may be measured and its contribution removed to leave the contribution by the pre- or post-pattern transfer processes. A contribution can be removed per process flow (e.g., a combination of patterning process steps and/or apparatus used) or per particular apparatus or part thereof (e.g., etch apparatus or etch chamber).

So, through these techniques, contributions to a parameter of interest can be obtained through modeled relationships or by removing known contributions from patterned substrate metrology data. Moreover, one or more contributions can be apparatus specific but also substrate independent. But one or more other contributions can be substrate specific. Thus, by appropriate mixing and matching of contributions, an estimate of a parameter of interest at a certain point in the patterning process can be estimated.

Therefore, some specific examples of the application of these contributions will now be described in the context of focus, CD and overlay to determine an estimate of the respective focus, CD and overlay for a substrate. As will be appreciated, additional or other parameters of interest can be processed and estimated.

To enable these examples, various data are used. For example, the lithographic apparatus has significant metrology capability integrated therein that is used for pattern transfer control. Examples of such integrated metrology are position measurement devices (e.g., sensor IF) of the substrate and/or patterning device for servo control, a levelling sensor (e.g. sensor LS) for measurement of the substrate surface for levelling control, an alignment sensor (e.g., sensor AS) to measure the orientation, position and/or deformation of the substrate to enable overlay control, and/or an aberration sensor (e.g., the shearing interferometer described above) in order control the wavefront of the projection system. The lithographic apparatus will use data from these sensors for control at a level where its overall CD, overlay, and/or focus budgets are satisfied but at the same time also keep track of residuals and/or errors that are left after control. These residuals and/or errors may be used to calculate what CD, overlay, and/or focus error is made during pattern transfer, i.e. the lithographic apparatus' contribution to the CD, overlay, and/or focus fingerprints. As will be appreciated, other apparatuses used in the patterning process may have similar information for the applicable metrology of the apparatus.

Further, lithographic apparatus setup or control can use one or more mathematical models to determine the respective calibration or control correction. However, such one or more models may have a built-in assumption or limit leading to a non-zero residual error. Such a model residual can be used to calculate what CD, overlay, and/or focus error is made, i.e. the model's contribution to the CD, overlay, and/or focus fingerprints. As will be appreciated, other apparatuses used in the patterning process can have similar model information.

Further, a lithographic apparatus may be set up by using in-resist measurements to help remove any global and local fingerprints of one or more parameters (e.g., focus, overlay, etc.). But, the global fingerprint can drift over time from the last time calibration was performed. For monitoring and control of this setup state, monitor substrates can be exposed and measured to monitor the global fingerprint. The monitor substrates can be basic substrates with a well-defined pattern in the substrate onto which a resist layer is applied, exposed with a pattern in relation to the well-defined pattern, developed and then measured. Once measured, the resist on the monitor substrate can be stripped to leave the well-defined pattern so that a new layer of resist can be applied. Based on those measurements, corrections can be made to the lithographic apparatus and so those corrections need to be factored in determining the contributions. In an embodiment, the monitor substrates can be used to determine overlay by using the well-defined pattern and/or to determine focus by using the resist pattern.

Turning to a focus example, the technique involves essentially two main parts. A first part is effectively a setup process to determine an underlying focus contribution of the lithographic apparatus that is not reflected in one or more types of lithographic apparatus processing variables that are used to determine an estimate of focus for a particular substrate in the estimation process. The second part is the estimation process of using a focus contribution associated with those one or more types of lithographic apparatus processing variables for the substrate under consideration to determine the estimate of focus for the particular substrate.

So, in the setup process according to an embodiment, patterned substrate focus metrology data is obtained for one or more substrates and then the contributions of one or more types of lithographic apparatus processing variables are removed similarly to as described above in FIG. 10. One type of contribution that can be removed is the focus contribution of a substrate height residual or error map associated with, e.g., the levelling sensor of the lithographic apparatus. A further type of contribution that can be removed is the focus contribution of projection system image plane deviation (IPD), which can be obtained, e.g., from a shearing interferometer and/or a projection system model residual. A further type of contribution that can be removed is the focus contribution of patterning device and/or substrate servo control (e.g., MA), which can be obtained from the applicable positioner, a position measurement device (e.g., sensor IF) and/or a residual of a servo control model. As discussed above, the translation from a processing variable to the focus contribution can be determined through simulation, mathematical modelling and/or experimentation.

As needed, the contribution fingerprints can be re-gridded to a same grid (which can be the same as the grid of one of the contribution fingerprints or a different grid). Similarly, the contribution fingerprints can be re-gridded to the patterned substrate metrology data, or vice versa. In an embodiment, the re-gridding comprises up sampling or down sampling.

In an embodiment, a filtering (e.g., moving average, deconvolution, FFT, etc.) is applied to a contribution, desirably before combining it with another contribution.

In an embodiment, the underlying focus contribution of the lithographic apparatus can effectively be determined once and used for various focus estimates and thus the amount of metrology can be significantly reduced compared to measuring each substrate. In an embodiment, the patterned substrate focus metrology data can be obtained by relatively sparse sampling of locations on the substrate (e.g., 500 targets or less on a substrate) and/or of the number of substrates from one or more lots (e.g., 10 or less substrates from a lot of 25 or more substrates).

In an embodiment, the patterned substrate focus metrology data can be a measured focus fingerprint of a monitor substrate as described above. Thus, data that is already being captured can be used. So, the measured focus fingerprint can be corrected for the lithographic apparatus impact as derived from lithographic apparatus sensor information, such as the focus contribution of projection system image plane deviation (IPD), the focus contribution of the substrate height residual or error map, and/or the focus contribution of patterning device and/or substrate servo control, to arrive at the underlying focus contribution of the lithographic apparatus.

The underlying focus contribution of the lithographic apparatus is then stored for use in on-product estimations of focus. The underlying focus contribution of the lithographic apparatus can be determined for multiple lithographic apparatuses. The underlying focus contribution of the lithographic apparatus can be determined for a particular combination of devices of the lithographic apparatus used. For example, the lithographic apparatus may have more than one substrate table on which the substrate could be exposed and so the underlying focus contribution of the lithographic apparatus can be determined for a specific combination and/or multiple combinations of devices used.

Then, for the on-product estimation, the errors or residuals of one or more types of lithographic apparatus processing variables relevant to focus are obtained for a substrate of interest and the focus contribution thereof is determined. For example, the focus contribution of projection system image plane deviation (IPD), the focus contribution of the substrate height residual or error map, and/or the focus contribution of patterning device and/or substrate servo control can be obtained for the substrate of interest. A further type of contribution that can be added is the focus contribution of patterning device errors attributable to the patterning device being used for the particular substrate of interest, which could be obtained by measurement. This contribution may be particularly used if the applicable underlying focus contribution of the lithographic apparatus was obtained without using the patterning device for the substrate of interest.

Further, an applicable underlying focus contribution of the lithographic apparatus, as described above, is obtained. Then, the applicable underlying focus contribution of the lithographic apparatus is combined, similarly to as described above in respect of FIG. 9, with the one or more specific focus contributions of the substrate of interest to obtain an estimated focus fingerprint for the substrate of interest. So, an estimate of focus error can be determined at any, or almost any, location on any substrate.

Now, turning to a CD example, in principle, there are a number of processing variables that can cause CD variation in a substrate. In this embodiment, certain CD variations across the substrate are considered. In particular, there are considered the CD variation contribution in respect of focus, focus blur, dose, and overall process. The patterning device, which is an intrafield contributor to CD variation, can also be considered but will not be further described for convenience only.

The focus contribution to CD can be based on focus contribution as described above, specifically the combination of the underlying lithographic apparatus focus contribution with the focus contributions of one or more processing variables of the lithographic apparatus for a substrate under consideration. This dense focus information can be, in principle, converted into a ΔCD contribution across the field and/or across substrate for any pattern feature given that, for example, the Bossung behavior of the feature (after-litho and/or after-etch) can be known through experiment or simulation. Hence, for any location (x, y) on the substrate with a focus value, a CD value can be calculated corresponding to that substrate location (x, y):

$$CD(HDFM_{x,y}) = \Phi_1(HDFM_{x,y})$$

wherein HDFM corresponds to a focus map such as the derived high density focus map as described above in the focus example.

The focus blur contribution to CD can be obtained using lithographic apparatus data, such as servo information (e.g., MSD in the z direction). The focus blur information can be converted into a ΔCD contribution across a scan direction and across the substrate. This focus blur data to CD conversion is also feature specific and can be known through experiment or simulation:

$$CD(fblur_{x,y}) = \Phi_2(fblur_{x,y})$$

wherein fblur corresponds to focus blurring.

The dose contribution to CD is due to the lithographic apparatus's dose variation (e.g. determined by a dose mapping system). The dose variation across the substrate during exposure can be translated into a ΔCD contribution using a suitable dose sensitivity of the applicable feature, which can be known through experiment or simulation:

$$CD(dose_{x,y}) = \Phi_3(dose_{x,y})$$

The overall process contribution to CD is a CD variation arising from various process steps as part of the patterning process separate from the pattern transfer alone. Thus, in an embodiment, the overall process contribution is the state of CD variation after the final etch step and not attributable to the various other CD variations considered in estimating the CD variation. Thus, in an embodiment, this contribution is the cumulative effect of all unaccounted for process variations arising from, e.g., film deposition variation, baking and/or developing variation, and/or etch process variation.

Examples of processing variables that contribute to the overall process contribution to CD may include a characteristic of structures under a resist layer, chemical composition and/or physical dimension of the resist layer, and/or a characteristic of one or more processes upstream, or downstream, to the pattern transfer in a lithography apparatus, such as spin coating, post exposure bake, development, etching, deposition, doping and/or packaging. And, while the overall process contribution to CD is described in terms of after etch, the overall process contribution can be obtained for different points in the patterning process, e.g., obtained after development but before etch.

So, similar to the setup process of the focus example, all of these ΔCD contributions due to focus, focus blur and dose can be used and subtracted from substrate CD measurements to estimate the overall process contribution. That is, in an embodiment, an after etch overall process contribution can be generated from an anchor feature CD measurement after etch, from which the ΔCD contributions for focus, focus blur and dose (for the anchor feature) are removed. As noted, the overall process contribution is estimated from a suitable anchor feature. So, in an embodiment, the overall process contribution for other features can be determined from the anchor feature. For example, the remainder of the overall process contribution can be expressed as a proportion of the anchor feature's characteristic. Where the overall process contribution is obtained for a different point in the patterning process, e.g., obtained after development but before etch, an after develop but before etch CD measurement can be used.

In an embodiment, the overall process contribution can effectively be determined once and used for various CD estimates and thus the amount of metrology can be significantly reduced compared to measuring each substrate. In an embodiment, the patterned substrate focus metrology data can be obtained by relatively sparse sampling of locations on the substrate (e.g., 500 targets or less on a substrate) and/or of the number of substrates from one or more lots (e.g., 10 or less substrates from a lot of 25 or more substrates).

The overall process contribution is then stored for use in on-product estimations of CD. The overall process contribution can be determined for a particular and/or multiple apparatus configurations (e.g., one or more specific etch chambers, one or more specific combinations of etch chamber and bake plate, one or more specific combinations of substrate table and etch chamber, etc.).

Then, similar to the focus estimation step described above, an estimation of on-product CD can be obtained. In an embodiment, the errors or residuals of one or more types of lithographic apparatus processing variables relevant to CD are obtained for a substrate of interest and the CD contribution thereof is determined. For example, the CD contribution of focus, focus blur and/or dose can be obtained for the substrate of interest. A further type of contribution that can be added is the CD contribution of patterning device errors attributable to the patterning device being used for the particular substrate of interest, which could be obtained by measurement.

Further, an applicable overall process contribution to CD, as described above, is obtained. Then, the applicable overall process contribution to CD is combined, similarly to as described above in respect of FIG. 9, with the one or more specific CD contributions of the substrate of interest to obtain an estimated CD fingerprint for the substrate of interest. So, an estimate of CD error can be determined at any, or almost any, location on any substrate.

Moreover, the estimate can be obtained for one or more specific pattern features of interest on a substrate, such as a hot spot. As noted above, the overall process contribution to CD was determined for a particular anchor feature, but can be scaled for the one or more specific features of interest. Further, the CD contribution of one or more types of lithographic apparatus processing variables (such as focus, focus blur and/or dose) can be computed based on an appropriate sensitivity for the one or more specific features between the CD variation and the one or more types of lithographic apparatus processing variables. Such sensitivity can be obtained, e.g., by simulation and/or experiment. Thus, multiple CD substrate fingerprints can be obtained, each for a different hot spot or other feature of interest of a pattern.

The methodology can be improved, e.g., with more parameters in one or more pertinent models, e.g., patterning device and/or aberration models. The methodology can be extended by, e.g., estimating the overall process contribution by breaking it up into different contributors, e.g. deposition, lithography, and/or etch with different sensitivities to different features.

In an embodiment, a dose correction applied as part of the patterning process can be corrected for in the results. For example, the lithocell may apply a dose correction using, for example, ASML's Dosemapper system. So, this correction is accounted for in the determination of the estimate of CD.

Turning now to an overlay example, data is used from at least two different pattern transfers onto the substrate. The techniques are similar to those described above in respect of the focus and CD examples.

This technique involves essentially two main parts. A first part is effectively a setup process to determine an underlying overlay contribution of the lithographic apparatus that is not reflected in one or more types of lithographic apparatus processing variables that are used to determine an estimate of overlay for a particular substrate in the estimation process. Optionally, an overall process overlay contribution can also be determined similar to the overall process CD contribution of the CD example discussed above. The second part is the estimation process of using an overlay contribution associated with those one or more types of lithographic apparatus processing variables for the substrate under consideration for each of the at least two pattern transfers to determine the estimate of overlay for the particular substrate.

So, in the setup process according to an embodiment, patterned substrate overlay metrology data is obtained for one or more substrates and then the contributions of one or more types of lithographic apparatus processing variables for each of at least two pattern transfers are removed similarly to as described above in FIG. 10. One type of contribution that can be removed is the overlay contribution of a substrate height map obtained, for example, from the levelling sensor of the lithographic apparatus. A difference can be found for the substrate height maps for two pattern transfers and then the difference can be converted to an overlay value and thus the overlay contribution. For example, the Z height difference can be turned into X and/or Y displacements by considering the height difference as a warpage or bend of the substrate and using first principles to calculate the X and/or Y displacements (e.g., the displacement can be the variation in Z versus the variation in X or Y times half the thickness of the substrate in, e.g., a clamped region of the substrate or the displacement can be calculated using Kirchoff-Love plate theory in, e.g., an unclamped region of the substrate). In an embodiment, the translation of the height to the overlay contribution can be determined through simulation, mathematical modelling and/or experimentation. So, by using such substrate height information per pattern transfer, the overlay impact due to a focus or chuck spot can be observed and accounted for.

A further type of contribution that can be removed is the overlay contribution of patterning device and/or substrate servo control (e.g., MA) in the X and/or Y directions (including rotation around Z), which can be obtained from the applicable positioner, a position measurement device (e.g., sensor IF) and/or a residual of a servo control model. A difference can be found for the servo control values across the substrate for two pattern transfers and then the difference can represent the overlay contribution. Where needed, the translation from servo control values to the overlay contribution can be determined through simulation, mathematical modelling and/or experimentation.

A further type of contribution that can be removed is the overlay contribution of projection system aberrations (which can be obtained, e.g., from a shearing interferometer) and/or projection system model residual. The translation from the aberrations and/or residual to the overlay contribution can be determined through simulation, mathematical modelling and/or experimentation.

A further type of contribution that can be removed is the overlay contribution of an alignment system model residual, which can be provided by the lithographic apparatus. The translation from the residual to the overlay contribution can be determined through simulation, mathematical modelling and/or experimentation. In an embodiment, the alignment system model residual can be different for different pattern transfer steps and thus a combination/difference of the alignment system model residuals for the different pattern transfer steps can be used to obtain the overlay contribution. In an embodiment, the alignment model residual can be corrected for substrate height.

As needed, the contribution fingerprints can be re-gridded to a same grid. Similarly, the contribution fingerprints can be re-gridded to the patterned substrate metrology data, or vice versa.

In an embodiment, the underlying overlay contribution of the lithographic apparatus can effectively be determined once and used for various overlay estimates and thus the amount of metrology can be significantly reduced compared to measuring each substrate. In an embodiment, the patterned substrate overlay metrology data can be obtained by relatively sparse sampling of locations on the substrate (e.g., 500 targets or less on a substrate) and/or of the number of substrates from one or more lots (e.g., 10 or less substrates from a lot of 25 or more substrates).

In an embodiment, the patterned substrate overlay metrology data can be a measured overlay fingerprint of a monitor substrate as described above. Thus, data that is already being captured can be used. So, the measured overlay fingerprint can be corrected for the lithographic apparatus impact as derived from lithographic apparatus sensor information, such as the overlay contribution of the projection system, the overlay contribution of the substrate height, the overlay contribution of alignment model residual, and/or the overlay contribution of patterning device and/or substrate servo control, to arrive at the underlying overlay contribution of the lithographic apparatus. In an embodiment, the measured overlay fingerprint data would be captured once for a first pattern transfer of the product substrate and then captured against for a second pattern transfer (with rework of the monitor substrate between pattern transfers). In an embodiment, the patterned substrate overlay metrology data is an overlay delta fingerprint obtained from the difference between the overlay fingerprint measured from the one or more monitor substrates after the first pattern transfer and the overlay fingerprint measured from the one or more monitor substrates after the second pattern transfer. So, by exposing a set of monitor substrates at about the same time as product layers, the lithographic apparatus contribution to overlay in terms of short term drift can be quantified. That is, with then overlay delta fingerprint, the lithographic apparatus contribution on interfield overlay due to short term drift between the first and second pattern transfers can be obtained.

Optionally, where an after-etch overlay is desired, an etch process contribution to overlay can be determined, which is an overlay variation arising from the etching. To obtain the etch process overlay contribution, after-develop but before etch patterned substrate metrology data can be removed from after-etch patterned substrate metrology data to obtain the etch process overlay contribution. In an embodiment, the etch process overlay contribution can effectively be determined once and used for overlay estimates and thus the amount of metrology can be significantly reduced compared to measuring each substrate. In an embodiment, the patterned substrate overlay metrology data can be obtained by relatively sparse sampling of locations on the substrate (e.g., 500 targets or less on a substrate) and/or of the number of substrates from one or more lots (e.g., 10 or less substrates from a lot of 25 or more substrates). The etch process fingerprint induced at a first or second pattern transfer could be deduced with a delta fingerprint between after develop but before etch overlay measurement and after etch overlay measurement after etch of the other of the first or second pattern transfer, assuming the etch fingerprint after each pattern transfer is the same.

The underlying overlay contribution of the lithographic apparatus (and the optional etch process overlay contribution) is then stored for use in on-product estimations of overlay. The underlying overlay contribution of the lithographic apparatus can be determined for multiple lithographic apparatuses. The underlying overlay contribution of the lithographic apparatus can be determined for a particular combination of devices of the lithographic apparatus used. For example, the lithographic apparatus may have more than one substrate table on which the substrate could be exposed and so the underlying overlay contribution of the lithographic apparatus can be determined for a specific combination and/or multiple combinations of devices used. The etch process overlay contribution can be determined for a particular and/or multiple apparatus configurations (e.g., one or more specific etch chambers).

Then, for the on-product estimation, the errors or residuals of one or more types of lithographic apparatus processing variables relevant to overlay are obtained for a substrate of interest and the overlay contribution thereof is determined. For example, the overlay contribution of the projection system, the overlay contribution of the substrate height, the overlay contribution of alignment model residual, and/or the overlay contribution of patterning device and/or substrate servo control, to arrive at the underlying overlay contribution of the lithographic apparatus can be obtained for the substrate of interest. In an embodiment, only the overlay contribution of the substrate height is obtained.

Further, an applicable underlying overlay contribution of the lithographic apparatus, as described above, is obtained and optionally the applicable etch process overlay contribution is obtained. Then, the applicable underlying overlay contribution of the lithographic apparatus (and optionally the optional etch process overlay contribution) is combined, similarly to as described above in respect of FIG. 9, with the one or more specific overlay contributions of the substrate of interest to obtain an estimated overlay fingerprint for the substrate of interest. So, an estimate of overlay can be determined at any almost location on any substrate.

In an embodiment, an overlay correction applied as part of the patterning process can be corrected for in the results. For example, the lithocell may apply an overlay correction, e.g., based on the measurements of the monitor substrates using, for example, ASML's Baseliner system. So, this correction is accounted for in the determination of the estimate of overlay.

In an embodiment, in a multiple patterning process, it is desirable that both exposure and lithographic apparatus conditions, e.g., exposure dose, patterning device transmission, patterning device qualification errors, illumination settings, lithographic apparatus substrate clamping errors, etc., are very similar between the first and second pattern transfer steps. Furthermore, the exposure and heating signature at intrafield level would be expected to be similar between the first and second pattern transfer steps and therefore such effects on overlay should be small.

Further, in an embodiment, a plurality of the predictions can be combined. For example, an overlay prediction and CD prediction can be combined. For example, in a multiple patterning situation that creates structures adjacent each other using different pattern transfer steps and those structures have a gap between them, a combination of the CD one or more of the different pattern transfer steps as well as an overlay for the different pattern transfer steps can give a better prediction of a size of the gap than an overlay or CD estimate alone.

Figure 11:
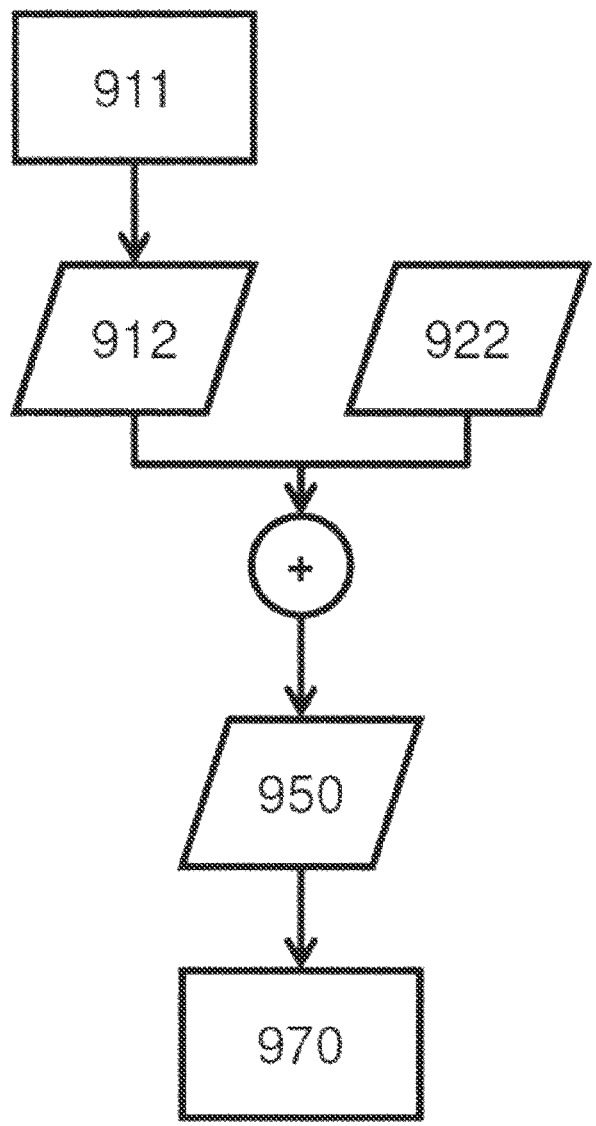
FIG. 11 schematically shows a flow for a method, according to an embodiment.

FIG. 11 then schematically shows a flow for a method, according to an embodiment. In particular, it shows how a generalized contribution, such as the underlying focus contribution of the lithographic apparatus, the overall process contribution to CD, and/or the underlying overlay contribution of the lithographic apparatus (and optionally the applicable etch process overlay contribution), can be applied to specific information for a substrate of interest to obtain an estimate of a parameter of interest for the substrate. So, contribution 912 corresponds to one or more processing variables of a particular substrate and, e.g., for a hot spot. This can be determined by modeling, from device information, etc. Further, a contribution 922 applicable to a plurality of substrates, such as the underlying focus contribution of the lithographic apparatus, the overall process contribution to CD, and/or the underlying overlay contribution of the lithographic apparatus (and optionally the applicable etch process overlay contribution), is obtained. The contribution 922 may be used in any of the techniques described herein. The contribution 912 may be determined for a plurality of substrates (e.g., for every substrate of interest) while the contribution 922 may be used repeatedly across many substrates. The contribution 912 and the contribution 922 are combined to obtain an estimate 950 of the parameter of interest for, e.g., a hot spot, without necessarily requiring obtaining patterned substrate metrology data for the hot spot. In procedure 970, an action is taken, such as whether there is a defect at the hot spot, is determined based on the estimate of the parameter of interest.

Thus, device sensor data can be exploited to enhance in-resist and/or after etch metrology to obtain a computed metrology that can, for example, provide dense metrology per substrate without having to have dense sampling of substrates and/or providing metrology for many, if not every, substrate without having to obtain patterned substrate metrology data for each such substrate. Further, the dense computed metrology can enable, for example, higher order corrections. The computed metrology can also enable greater control, including possibly per substrate control, without having to obtain patterned substrate metrology data for each such substrate and/or without having to measure patterned substrate metrology data densely on substrates.

Moreover, the estimates from these computed metrology techniques can enable various applications, such as patterning process control (e.g., adjustment of one or more process variables), patterning processing monitoring, fault detection, defect prediction, patterning process design, etc.

In an embodiment, a derived contribution (such as derived using FIG. 10) can be used to parameterize a mathematical model for determining the contribution of change of one or more processing variables to a parameter of interest. That is, a mathematical model can be fitted against the derived contribution, thereby obtaining the values of one or more parameters, constants, etc. of the mathematical model. So, as an example, it is desirable to have a model and any sensitivities represented in the model to adapt to changes in a process and/or substrate stack. So, in an embodiment, a predicted substrate fingerprint for every substrate that will be measured can be generated. For this, a model of a parameter of interest can be established, e.g., for CD, a model comprising $CD=a1*DOSE+a2*FOCUS^2+a3*MSDx+a4*MSDy+a5*MSDz+\ldots$. With measurement of a substrate, the pre- and/or post-process (e.g., track/etch) fingerprint and the patterning device fingerprint can be removed. The remaining fingerprint measurements can be compared to the predicted values. In this situation, there are now a set of equations (as many equations as measurement points) where the CD, dose, focus, MSD-xyz, aberrations, etc. are known. This set of equations can be solved for the sensitivities (a1, a2, . . . ) that are desired. When this is performed for a number of substrates measured for a certain device pattern, there will be plenty of data to re-estimate the sensitivities desired. If data from multiple lithographic apparatuses are used and/or data from focus exposure matrix exposures are used in the same fashion, sufficient variation in the input signals (e.g., focus, dose, MSD, CD, etc.) can enable proper estimation of sensitivities. Further, the technique can be applied to other parameters of interest such as depth of focus, exposure latitude, overlay, edge position, etc.

In an embodiment, a training algorithm could be used to add further accuracy. For example, when the sensitivities for aberration are solved, a boundary condition can be taken into account that the aberration can only vary over the slit and pre-filter the CD (or overlay) data before fitting these sensitivities. In an embodiment, the sensitivities can become robust against variations in the patterning process by re-assessing them from time to time or continuously.

In a further application of the contribution/fingerprint discussed above, a contour of a pattern can be predicted using one or more contributions/fingerprints. In this context, a contour is an outline of a shape of a feature of a pattern transferred to a substrate. A contour can be, for example, visualized by processing an image (e.g., scanning electron microscope image) of a substrate to extract the outer boundary of shape of a pattern feature transferred to the substrate. But, a contour can also be generated by mathematical processes (e.g., simulation) to create an electronic representation of a pattern feature as it is expected to be transferred to the substrate. While a contour will typically be in the form of a line, the contour as used herein can be generalized more to data describing the boundary of the feature. The contour need not be continuous; that is, the outline and/or data can be discontinuous around the feature if the discontinuous outline and/or data sufficiently describes the boundary of the feature. In an embodiment, the contour can be two-dimensional (i.e., defined a plane) or three-dimensional. In an embodiment, the contour can extend in a plane substantially parallel to the surface of the substrate on which the pattern is formed. In an embodiment, the contour can extend in a plane substantially perpendicular to the surface of the substrate on which the pattern is formed; in which case it can be characterized as a profile and can be of two-dimensional or three-dimensional form.

To predict the contour, one or more contributions/fingerprints can be obtained as described herein and used to select a certain nominal contour and/or modify a nominal contour, in order to arrive at a predicted contour. Details of such prediction and use of a contour using one or more contributions/fingerprints along with other uses of the one or more contributions/fingerprints described herein are described in U.S. Application No. 62/462,201, filed Feb. 22, 2017, which is incorporated herein in its entirety by reference.

As noted above, in an embodiment, the computation metrology techniques herein can use a combination of data from an apparatus (e.g., a lithographic apparatus) of the patterning process and data from a metrology apparatus (e.g., one of the metrology apparatuses described above in respect of FIGS. 3-5) to generate a derived contribution or fingerprint of a particular parameter of interest of the patterning process (e.g., overlay, edge placement error, etc.) for a substrate. So, in such a computational metrology application, hybrid-dense fingerprints of a particular parameter of interest are generated based on metrology and patterning process apparatus (e.g., lithographic apparatus) inputs. For example, for an overlay fingerprint, inputs can be, e.g., measurements made using one or monitor substrates, data or measurements from a patterning process manufacturing apparatus (e.g., a lithographic apparatus), and/or measurements (such as after-etch inspection (AEI) or after-development inspection (ADI) measurement results) from a metrology apparatus (such as one of the metrology apparatuses described above in respect of FIGS. 3-5).

For the hybrid-dense fingerprints described above, relatively dense measurements of the parameter of interest using a metrology apparatus measuring metrology targets (e.g., ADI and/or AEI) are used to enable a good matching between the parameter measurements from the targets and the device pattern response in order to generate the fingerprints. Thus, it would be desirable to, for example, be able to use less dense measurements of the parameter of interest by a metrology apparatus measuring metrology targets. Using less dense measurements can enable increased throughput since fewer measurements of metrology targets may be required.

Additionally or alternatively, the resulting fingerprint described above can be generic for all device pattern features and may not make reference to, e.g., critical device pattern features (also referred to as hot spots). Thus, it would be desirable to be able to generate, for each particular feature of a plurality of features of a device pattern, a fingerprint specific to the particular feature of the device pattern. In an embodiment, the fingerprint can be specific to one or more critical device pattern features. It can be more informative (e.g., in terms of device yield control) to have a dense map of a parameter of interest (e.g., overlay, focus, CD, alignment, etc.) associated with critical device pattern features. By having a focus on critical device pattern features, a yield-based design, control, modification, etc. of the patterning process can be created by, e.g., taking specific feature characteristics of a device pattern into account.

Figure 12:
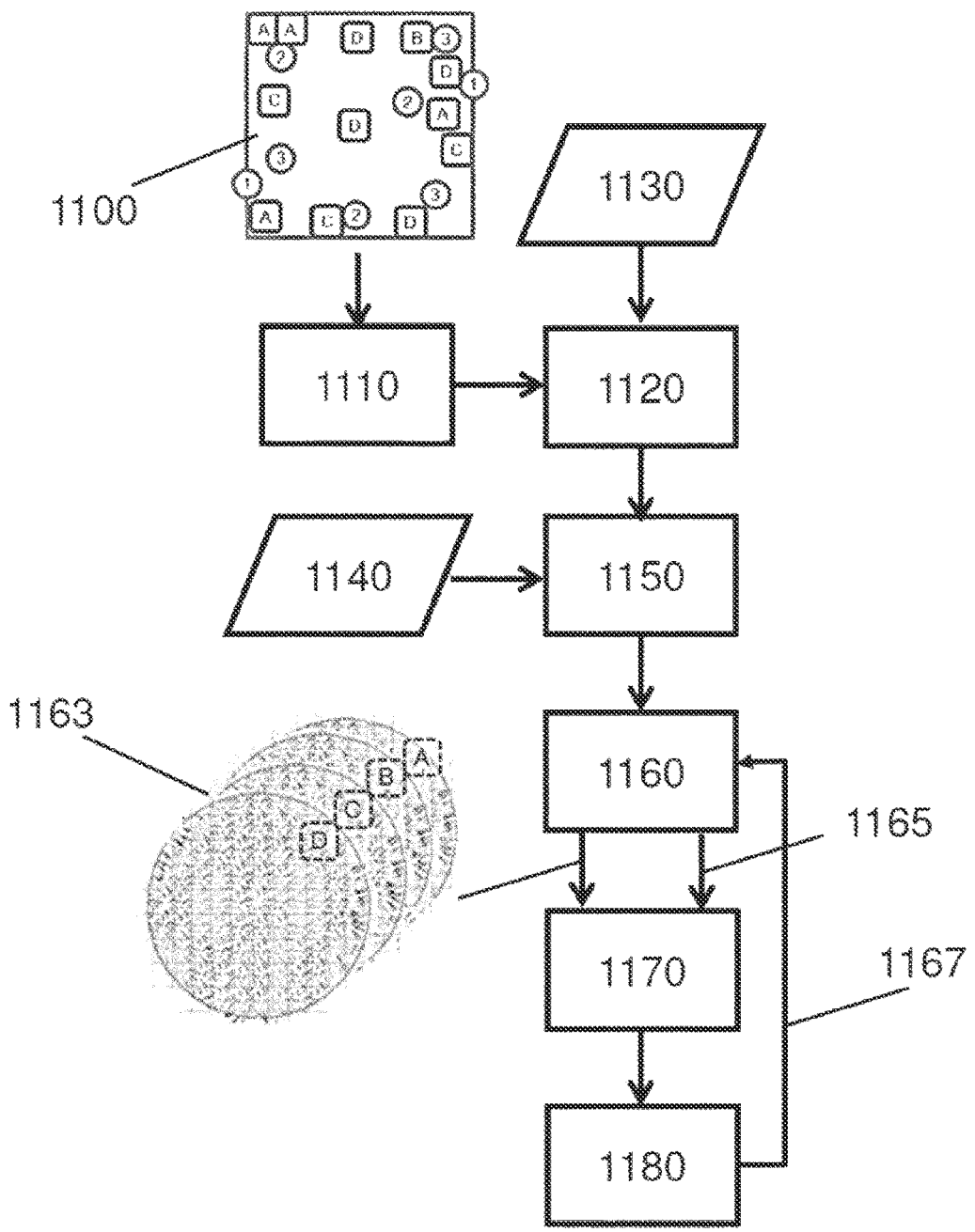
FIG. 12 schematically shows a flow for a method, according to an embodiment.

Referring to FIG. 12, an embodiment of a method of generating and using a fingerprint specific to a particular feature of a device pattern is schematically depicted. In general terms, the method involves creation of a parameter of interest fingerprint (map) across at least part of a substrate for one or more specific device pattern features by combination of simulation (e.g., full chip simulation), metrology measurements using metrology targets (e.g., ADI/AEI overlay measurements for an overlay fingerprint) and on-device pattern measurements. For example, the parameter fingerprint can be created for each of one or more critical device pattern features. With the one or more parameter fingerprints (e.g., for one or more critical device pattern features), one or more aspects (e.g., an apparatus, a sub-process, a consumable used (e.g., a patterning device), etc.) of the patterning process can be designed, corrected, controlled, modified, etc. using the one or more parameter fingerprints. In an embodiment, a weighted combination of an available plurality of parameter fingerprints of respective device pattern features can be used for the design, correction, control, modification, etc. of the aspect of the patterning process; that is, one or more parameter fingerprints associated with respective specific device pattern features can be higher weighted than one or more other parameter fingerprints associated with other respective device pattern features. Such design, correction, control, modification, etc. can include configuration of a setting of an apparatus (e.g., a lithography apparatus, an etching tool, a deposition tool, etc.) used in the patterning process to manufacture device patterns on substrates using the patterning process. In an embodiment, the design, correction, control, modification, etc. can include a modification of a lithographic apparatus setting (e.g., modification of the control of X, Y or Z motion of an object such as the substrate, specific correction of a projection system aberration (e.g., using an actuator or other wavefront manipulation device in the projection system), change of an illumination dose for exposure of a substrate (e.g., by controlling a radiation source and/or using a dose modulation device in the illumination system), etc.).

At 1100, an example highly schematic layout of a patterning device pattern having device pattern features and metrology targets as provided at the patterning device are depicted. The device pattern features are marked as features A, B, C, and D. As will be appreciated, each instance of feature A is substantially the same type of pattern layout, each instance of feature B is substantially the same type of pattern layout, each instance of feature C is substantially the same type of pattern layout, and each instance of feature D is substantially the same type of pattern layout. Further, each of features A-D may be different than the other features. Further, metrology targets are marked as targets 1, 2 and 3. As will be appreciated, each instance of target 1 is substantially the same type of metrology target, each instance of target 2 is substantially the same type of metrology target, and each instance of target 3 is substantially the same type of metrology target. In an embodiment, each of metrology targets 1-3 may be different than the other targets (e.g., differ in terms of pitch of target periodic structures, differ in terms of segmentation of features of target periodic structures, differ in terms of duty cycle, etc.). As is known, the device pattern features and metrology targets are transferred to the substrate using a lithographic process. In the case of a metrology target for overlay, the targets 1, 2 and 3 can be a target for a lower layer on the substrate or a target for an upper layer on the substrate, wherein the target 1, 2, or 3 generally lies over a corresponding target in a lower layer or a corresponding target in an upper layer will generally lie over the target 1, 2, or 3.

At 1110, a simulation is performed of transfer of the patterning device pattern to the substrate, e.g., at various conditions of the patterning process such as a certain amount of perturbations from nominal conditions of the patterning process. For example, the patterning simulation method of FIG. 13 can be used to generate a predicted transfer of the patterning device pattern (including the one or more metrology targets) to the substrate. Similarly, measurement of the one or more metrology target created as part of the simulated patterning process is also simulated, for example, at multiple measurement beam wavelengths and/or multiple measurement polarizations. For example, the measurement can be simulated using the measurement simulation method of FIG. 14. Based on these simulations, a parameter of interest (e.g., overlay) for each of the one or more metrology targets and the one or more device pattern features as simulated to be produced on the substrate is determined and a relation of the parameter between the one or more metrology targets and the one or more device features of the patterning device pattern as simulated to be produced on the substrate is determined from the simulated results. For example, depending on the pattern transfer conditions and for overlay as the parameter of interest, a device pattern feature shift can be related to an overlay target shift. In an embodiment, for the purposes of the relationship, the parameter of interest of the one or more metrology targets can be different than the parameter of interest of the one or more device features; for the parameter of interest for the one or more metrology targets can be overlay while the parameter of interest of the one or more device features is edge placement error. Additionally or alternatively, other relationships can be established such as one or more optical aberration sensitivities of the parameter of interest, one or more focus sensitivities of the parameter of interest, one or more dose sensitivities of the parameter of interest, one or more pitch dependencies of the parameter of interest, etc.

At 1130, measurements of the applicable parameter of interest are obtained from one or more substrates onto which the patterning device pattern has been transferred using the patterning process for which the simulations at 1110 are performed. In an embodiment, the measurements are obtained from across a substrate having a plurality of instances of the patterning device pattern transferred thereto. In an embodiment, the measurements are obtained from a plurality of substrates onto each of which the patterning device pattern has been transferred a plurality of times. In an embodiment, the measurements are obtained from the one or more metrology targets as transferred to the one or more substrates as part of the patterning process. In an embodiment, the parameter of interest is overlay and the measurements are overlay measurements obtained using ADI and/or AEI of the one or more metrology targets. In an embodiment, the overlay measurements are obtained at multiple measurement beam wavelengths and/or multiple measurement beam polarizations.

At 1120, the measurements of the parameter of interest from the one or more metrology targets are matched to the simulated results. That is, using the one or more relations determined from the simulations, a measured parameter of interest can be translated into an equivalent value of the applicable parameter of interest (e.g., the same parameter of interest or a different one) for a device pattern feature. For example, in the context of overlay, a measurement of overlay from a metrology target can be translated to an expected overlay of an associated device pattern feature using the one or more simulated relations. In an embodiment, the metrology measurements are obtained across the substrate and thus will likely have varying values due to local conditions (e.g., substrate unflatness, variation in etching, etc.) at the various locations across the substrate. So, in an embodiment, a map across at least part of a substrate of the predicted parameter of interest for each of one or more specific device pattern features can be obtained. In an embodiment, the parameter of interest can be an error or residual of a parameter, e.g., CD error. Considering the overlay example, a map of predicted overlay of a specific device pattern feature across at least part of a substrate can be determined by matching metrology target overlay measurements taken from across the at least part of the substrate to the specific device pattern feature created across the at least part of the substrate using the one or more simulated relations. A similar overlay map can be created for each of another plurality of specific device pattern features, each device pattern feature having instances thereof spread across at least part of the substrate. In an embodiment, the overlay map is effectively a spatial distribution of overlay vectors across the at least part of the substrate, each vector having a direction of the overlay and a magnitude of the overlay. The result then is that the data can be combined to yield a predicted parameter of interest (e.g., overlay, edge placement error, etc.) substrate map per device pattern feature. In an embodiment, the substrate map can be constructed based on full chip information, and so can be densely sampled over the field/substrate.

At 1140, measurements of one or more patterning device pattern features are obtained from one or more substrates onto which the patterning device pattern has been transferred using the patterning process for which the simulations at 1110 have been performed. In an embodiment, the measurements are obtained from across a substrate having a plurality of instances of the patterning device pattern transferred thereto. In an embodiment, the measurements are obtained from a plurality of substrates onto each of which the patterning device pattern has been transferred a plurality of times. In an embodiment, the measurements are on-device measurements. That is, the measurements are of device features themselves rather than those obtained from one or more metrology targets around the device pattern. In an embodiment, the on-device measurements are obtained using an ion beam (e.g., electron beam) measurement technique, such as electron microscopy. In an embodiment, the measurements are edge placements, CDs, etc. of device pattern features.

At 1150, based on the on-device measurements, the relation between simulated device pattern features (e.g., determined from the simulations described above for 1110) and the measured parameter of interest (e.g., determined at 1130 and matched with the simulated device pattern features at 1120) can be correlated. This correlation can be done by analysis of on-device measurement of the device features. For example, in the context of overlay, edge placement errors determined from on-device measurements can be identified for features for which an overlay has been predicted based on a relation between the simulated device pattern features and the measured overlay from an associated metrology target and the predicted overlay can be correlated to the measured on-device edge placement errors. As an example, an error in a distance between edges of adjacent features that were created in separate patterning process executions can be correlated to the predicted overlay. The correlation can then be used to translate the predicted overlay into a more accurate prediction of the overlay and/or the edge placement error of the device feature. And so, per patterning device pattern feature, a fairly highly predictive and accurate parameter of interest (e.g., overlay, edge placement error, etc.) substrate map can be constructed per device pattern feature.

Optionally, the parameter of interest substrate maps per device pattern feature can have other associated data. For example, the maps may include information regarding a cross-dependency with a control parameter within the patterning process, wherein the control parameter is a parameter that can be set in an apparatus used by the patterning process to change the performance of at least part of the patterning process. In an embodiment, the control parameter is a parameter that controls operation of the lithographic apparatus. In an embodiment, the control parameter is a parameter to control focus, projection system aberrations, etc. within the lithographic apparatus. So, the parameter of interest substrate maps can include one or more cross-dependencies with one or more lithographic apparatus control parameters (e.g., focus, projection system operation, etc.). This cross-dependency can then enable an appropriate correction to be made as the parameter of interest of a certain feature of the device pattern may have a different change in value in response to a change in a value of the control parameter than another feature of the device pattern.

While reference has been made to a plurality of maps, it will be appreciated that one or more of the maps can be combined into a combination map (which is considered as a plurality of maps combined together in combining data structure). In an embodiment, all the maps can be combined into a combination map or a subset of the maps can be combined into a combination map with one or more remaining separate maps. For example, a substrate map per device pattern feature for each of a plurality of device pattern features can be translated into a combination substrate map that combines the data along with an associated sampling per one or more device pattern features included in the combination substrate map. That is, based on the combination substrate map, the data for the one or more relevant device pattern features can be selected out based on the applicable sampling definition.

So, in steps 1120 and 1150, measurements 1130 of a parameter of interest (using one or more metrology targets) have been translated into an applicable parameter of interest map (e.g., which parameter of interest is the same or different than the measured parameter of interest) per device pattern feature using computational lithography and metrology simulations and on-device measurements 1140. For example in the context of overlay, overlay measurements using one or more overlay metrology targets can be translated into an overlay map per device pattern feature using computational lithography and metrology simulations (feed-forward) and on-device measurements (feed-back). To put this technique into context, the measurements 1130 can be obtained relatively quickly and can be obtained relatively sparsely across the substrate. Moreover, the one or more metrology targets are designed to act essentially as a proxy for the behavior of the device pattern features but are not measurements of the actual behavior of the device pattern features. So, at step 1120, the relatively sparse measurements of a parameter of interest using the one or more metrology targets are converted by use of one or more simulated relations into a value of a (same or different) parameter of interest corresponding to one or more device pattern features. In particular, the sparse measurements are matched to various device pattern features to provide a predicted value of a parameter of interest for each of a plurality of device pattern features, yielding effectively a parameter of interest substrate map per device pattern feature. Desirably, the result is a more dense representation of a parameter of interest across the substrate by converting the metrology target measurements of the parameter of interest to each of a plurality of device pattern features, wherein each of the device pattern features can have multiple instances thereof with a field/die and will have multiple instances thereof across the plurality of dies/fields across the substrate. Now, to reflect the actual behavior of the device pattern features, on-device measurements are obtained, which on-device measurements can be relatively sparse as well. Using the on-device measurements, a correlation between the on-device measurements and a relation between the simulated pattern features and the measured metrology target measurements can be established to enable more accurate prediction of the parameter of interest for the device pattern features. That correlation can be used to improve the predicted parameter of interest for a device pattern feature to yield a fairly highly predictive and accurate parameter of interest substrate map per device pattern feature.

At 1160 through 1180, the substrate maps per device pattern feature can be used to make a correction in an aspect (e.g., an apparatus (such as a lithographic apparatus, an etching tool, a deposition tool, etc.), a sub-process (e.g., a pattern step, an etching step, etc.), a consumable used (e.g., a patterning device), etc.) of the patterning process. The correction can be a feedforward or feedback correction. In an embodiment, the correction is made in the lithographic apparatus using one or more control parameters of the lithographic apparatus (e.g., control parameter of dose, a control parameter of focus (e.g., control of Z position of the substrate), a control parameter of alignment (e.g., control of a X and/or Y position of the substrate), a control parameter of optical aberration, etc.

At 1160, where there are a plurality of parameter of interest substrate maps (each map corresponding to a device pattern feature), a subset of one or more device pattern features from the plurality of device pattern features can be selected based on the applicable parameter of interest substrate maps and on data regarding an expected or actual behavior of at least part of the patterning process. For example, one or more critical device pattern features can be identified and then the respective parameter of interest substrate map(s) of the one or more critical device pattern features can be used in correction of at least part of the patterning process.

In an embodiment, the expected or actual behavior data comprises data 1167 from an apparatus 1180 used in the patterning process, such as, in the case of a lithographic apparatus, data regarding the actual or expected X, Y and/or Z position of the substrate (e.g., in the form of moving average and/or moving standard deviation information, in the form of substrate height or unflatness information, in the form of alignment errors, etc.), regarding the optical aberration (e.g., measured values of aberration in the form of, e.g., Zernike aberration specifications), regarding the dose (e.g., dose errors, which can be measured by a sensor in the apparatus), etc. The behavior data can be output from the apparatus as measured values and/or as data generated as part of the control of the apparatus. The behavior data can be collected from processing of prior substrates for use in control of the processing of one or more subsequent substrates. The behavior data can be generated from a mathematical model that predicts the behavior based on certain input (e.g., data from prior processing of substrates). In an embodiment, the behavior data comprises a range of behaviors, such as a range or set of behaviors around or adjacent to a nominal behavior.

Using the behavior data, an expected impact of the behavior on the parameter of interest represented by the substrate maps of the device pattern features can be determined. For example, in the context of overlay and a lithographic apparatus, it can be calculated, for example, what a certain dose error, optical aberration, position error, etc. will cause in terms of overlay based on sensitivities of overlay to one or more of those behaviors (which sensitivities can be determined by simulation or experimentation). That calculated overlay can be processed with a plurality of overlay substrate maps, each overlay substrate map being per device pattern feature, to determine which one device pattern features are likely to be produced out of specification (e.g., likely to be defective) in the face of the behavior of the at least part of the patterning process. Thresholds can be applied to identify which one or more device pattern features are likely to be produced out of specification as a result of the behavior. As a simple example, an overlay substrate map for a particular device pattern feature may identify that in a certain region of the substrate the device pattern feature is expected to have an overlay of 2 nm in the positive X direction and a specification for overlay for device pattern feature may be set at 4 nm (i.e., an overlay of 4 nm or less is acceptable for this device pattern feature). Then, if the actual or expected behavior is determined to cause a 1-3 nm overlay in the positive X direction, then this device pattern feature can be considered critical since the 2 nm of overlay from the substrate map plus the 1-3 nm overlay from the actual or expected behavior is likely to cause the device pattern feature to be out of specification. Of course, a different analysis can be performed.

The result of the analysis of 1160 is a set 1163 of parameter substrate maps, wherein each map is for a respective device pattern feature identified as a critical device pattern feature. This is schematically shown in FIG. 12 as a set of substrate maps of overlay (in this example) for each of features A, B, C and D, which are each identified in this example as critical features. As seen in FIG. 12, each of the overlay substrate maps show overlay vectors for its associated device pattern feature across the substrate. It can be seen that in some regions the vectors are relatively large in magnitude, making the device pattern feature critical particular depending on the behavior of the patterning process.

Now, the analysis 1160 can further determine weights for the parameter substrate maps, such as the maps identified as being for critical device pattern features. The weights can more heavily weight a parameter substrate map for a first particular device pattern feature relative to a parameter substrate map for a second particular device pattern feature as part of determining a correction to be made. For example, it can be determined that in view of the actual or expected behavior that the first device pattern feature is more likely to be out of specification, is expected to be further out of specification, etc. than the second device pattern feature. Accordingly, the parameter substrate map for the first device pattern feature can be more heavily weighted in the correction analysis than the parameter substrate map for the second device pattern feature. Thus, one or more weights 1165 can be produced and may be provided along with the set 1163 of parameter substrate maps, wherein each map is for a respective device pattern feature identified as a critical device pattern feature.

At 1170, one or more corrections of at least part of the patterning process based on one or more parameter of interest substrate maps, each map being per device pattern feature, are determined. For example, the corrections can be calculated using the set 1163 of parameter substrate maps, wherein each map is for a respective device pattern feature identified as a critical device pattern feature. Additionally or alternatively, the corrections can factor in the one or more weights 1165, e.g., a weighed metric such a1*F1+ . . . +an*Fn can be used, wherein a corresponds to the weight, F corresponds to the parameter substrate map for a particular device pattern feature (e.g., a critical feature) and n is the number of device pattern features. In an embodiment, the corrections can factor in an actual or expected behavior of at least part of the patterning process.

At 1180, the one or more corrections can be applied by an apparatus used in the patterning process. In an embodiment, the corrections can be converted/translated for use in the apparatus. In an embodiment, the analysis of any one or more of steps 1110, 1120, 1150, 1160 and/or 1170 can be performed in the apparatus at 1180.

So, in an embodiment, a correction can be determined, based on at least the substrate maps (in, for example, a weighted fashion), that is within the capabilities of the one or more correction mechanisms of the patterning process system to yield improved creation of the device pattern features. For example, in the case of a lithographic apparatus, the parameter substrate maps can be used to create values of one or more control parameters (e.g., focus, dose, optical aberration, X, Y and/or Z position, etc.) of the lithographic apparatus that effect a correction to the production of one or more of the device pattern features. In an embodiment, the parameter substrate maps enable lithographic apparatus pattern transfer control based on device pattern feature weighting so as to target the corrections to the most critical device pattern features.

In an embodiment, the parameter substrate map for a particular device feature can be used with one or more other parameter substrate maps (which may be device feature specific or not) of a different parameter of interest for the purposes of design, determining a correction, etc. For example, a substrate map of overlay can be used with a substrate map of focus and/or CD (which substrate map can be specific for the particular feature of the overlay map or can be generic) for overlay correction. For example, a defocus from a focus substrate map might provide information for the purposes of correction of an overlay shift due to, e.g., projection system aberrations.

In review, there is provided for the creation of a parameter of interest (e.g., overlay) substrate map per device pattern feature by combination of computational lithography and metrology simulation (e.g., a combination of a full chip computational lithography with a metrology target measurement simulation), metrology target measurements (e.g., ADI/AEI overlay measurements) and on-device measurements. Effectively, there is provided a computational intra-field sampling to provide an improved representation of the parameter of interest across the substrate. With the one or more substrate maps, a correction can be made in the patterning process based on the one or more substrate maps to help ameliorate the parameter of interest for one or more particular device pattern features. For example, the correction may be made in the lithographic apparatus (e.g., correction of X position, Y position, and/or Z position of the substrate, correction of optical aberrations, correction of dose, etc.). In an embodiment, a plurality of substrate maps (each map corresponding to a different device pattern feature) is used in a weighted combination to make the correction. Thus, a device pattern feature-weighted feedback can be provided to an appropriate apparatus in the patterning process to enable an appropriate correction.

In an overlay embodiment, the technique described herein can use computational lithography to predict overlay/pattern shift (e.g., alignment) of particular device pattern features based on, e.g., device pattern layout information and patterning process parameters (such as optical aberrations, dose, stage position, etc.). Overlay/alignment data from metrology targets is then used to anchor predicted overlay/alignment of the device pattern features at selected locations. Then, device pattern feature specific dense overlay/alignment maps are created based on the predicted dense overlay (from the dense computational lithography) and sparse overlay/alignment measurements. On-device measurements can be used to correlate the sparse overlay/alignment measurements to the predicted dense overlay. Using those device pattern feature specific maps, corrections can be generated. For example, maps for critical device pattern features can be identified based on actual or expected patterning process behavior and used in the correction. Further, weights can be assigned to certain maps so as to enable targeting of specific device pattern features (such as more critical device pattern features).

This parameter of interest substrate map per device pattern feature technique can yield one or more benefits. For example, it can yield a reduction of parameter of interest accuracy errors with respect to the applicable device pattern features by a combining the relative high density obtainable from the simulations with a verification using by measured data (e.g., metrology target data and on-device measurement data). Further, this technique can be use limited parameter measurement sampling because the spatial information can be obtained via extrapolation based on the simulations and can yield higher spatial resolution of parameter information. The substrate map per device pattern feature also enables separation of different processing fingerprints depending on the device pattern feature. Different device pattern features can have a different inter-field and/or intra-field fingerprint and so the separation of the fingerprint enables improved targeting of errors using correction mechanisms within the patterning process system. Further, weighted correction of device pattern features enables, for example, more tailored intra-field corrections which can be adapted to the capabilities of the correction mechanisms within the patterning process system.

In an embodiment, the metrology targets are positioned close to the device pattern features to reduce or minimize differences in optical aberrations when creating the device pattern features and the metrology targets. But, in an embodiment, the simulations can be used to "bridge" any differences by appropriate metrology target selection and sensitivity analysis. As a result, fewer metrology targets may be needed to predict the behavior of the device pattern features.

In an embodiment, the computational metrology simulation can be used to design metrology targets that are optimized toward the behavior of certain device pattern features. That is, the pitch, segmentation, etc. of certain metrology targets can be selected so that a parameter of interest measured from those targets is highly (e.g., most) representative of certain device pattern features relative to other device pattern features, such as critical device pattern features. Accordingly, the device pattern feature may have a variety of different metrology target types, with different metrology target types being more representative of one or more certain device pattern features than of other device pattern features.

In an embodiment, the on-device measurement can be used to verify the correctness of the computational lithography and/or to calibrate a computational lithography model.

The results of the methods herein (or another result (e.g., a defect prediction) derived from the results of the methods herein) can be used for various purposes including control of a process in the patterning process or an apparatus therein, monitoring of substrates produced by the patterning process, design of a process or apparatus of the patterning process, etc. For example, the results or another result derived therefrom can be used to alter an apparatus or process of the patterning process for the further processing of the substrate or for the processing of another substrate. For example, the results can be used to predict a defect. Prediction of a defect can be used, for example, to control a metrology tool to inspect the affected area and/or alter an apparatus or process of the patterning process for the further processing of the substrate or for the processing of another substrate. Further, the results can be used to design the patterning process by, e.g., deriving a dose recipe for correction of the lithographic apparatus, enabling design of the patterning device and its pattern, setup of a process, etc. Further, the results can be used in model calibration, e.g., calibration of an optical proximity correction model, a source-mask optimization model, a lithographic manufacturing check model, a resist model, an imaging model, a measurement model (e.g., models the process of measuring), etc. The results can be used to determine one or more variables of a process (e.g., best exposure and/or best dose) which can then be used for various purposes. As will be appreciated, there can be many other uses.

Figure 13:
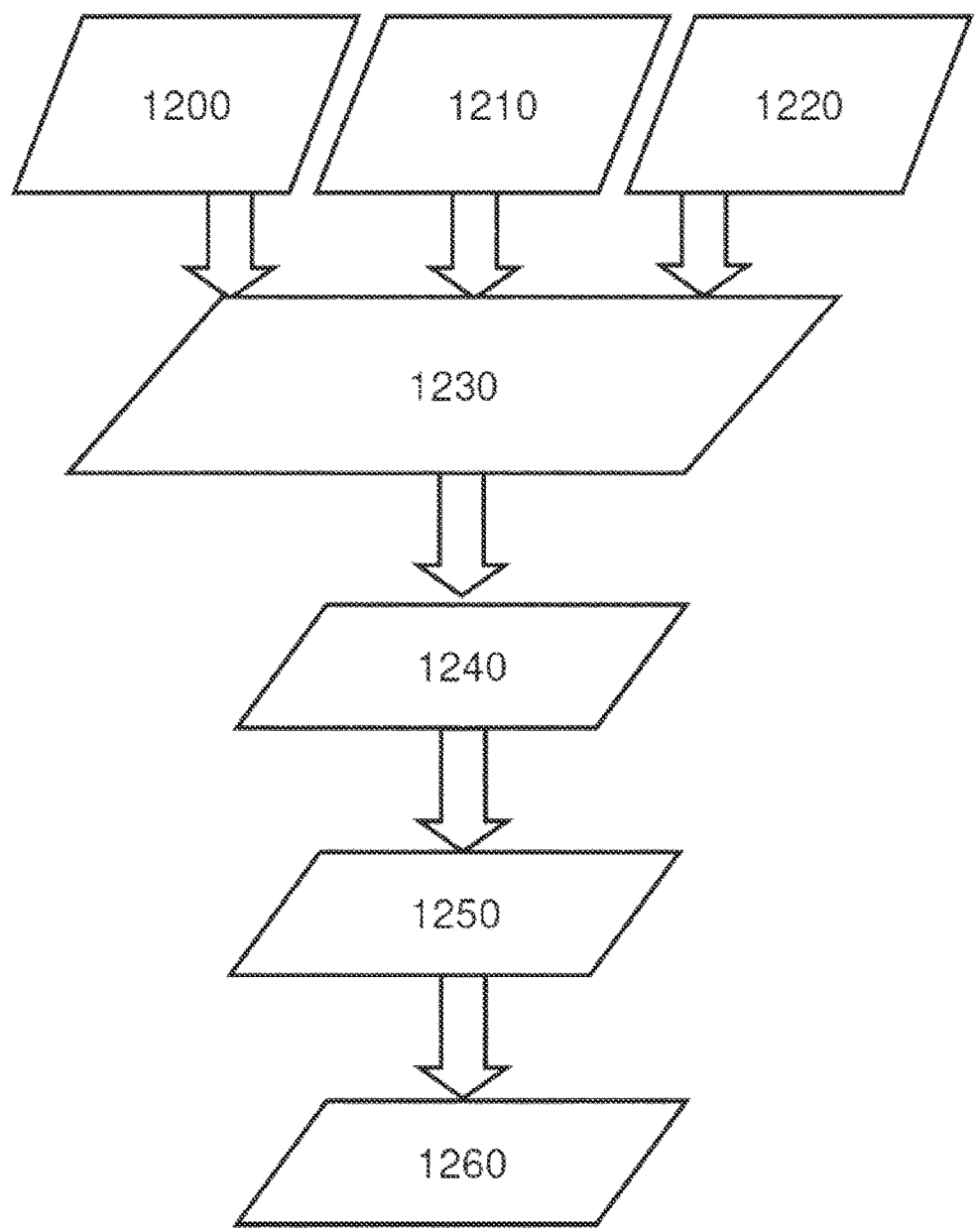
FIG. 13 schematically shows a flow for a method, according to an embodiment.

An exemplary flow chart for modelling and/or simulating parts of a patterning process is illustrated in FIG. 13. As will be appreciated, the models may represent a different patterning process and need not comprise all the models described below. A source model 1200 represents optical characteristics (including radiation intensity distribution, bandwidth and/or phase distribution) of the illumination of a patterning device. The source model 1200 can represent the optical characteristics of the illumination that include, but not limited to, numerical aperture settings, illumination sigma (σ) settings as well as any particular illumination shape (e.g. off-axis radiation shape such as annular, quadrupole, dipole, etc.), where σ (or sigma) is outer radial extent of the illuminator.

A projection optics model 1210 represents optical characteristics (including changes to the radiation intensity distribution and/or the phase distribution caused by the projection optics) of the projection optics. The projection optics model 1210 can represent the optical characteristics of the projection optics, including aberration, distortion, one or more refractive indexes, one or more physical sizes, one or more physical dimensions, etc.

The patterning device/design layout model module 1220 captures how the design features are laid out in the pattern of the patterning device and may include a representation of detailed physical properties of the patterning device, as described, for example, in U.S. Pat. No. 7,587,704, which is incorporated by reference in its entirety. In an embodiment, the patterning device/design layout model module 1220 represents optical characteristics (including changes to the radiation intensity distribution and/or the phase distribution caused by a given design layout) of a design layout (e.g., a device design layout corresponding to a feature of an integrated circuit, a memory, an electronic device, etc.), which is the representation of an arrangement of features on or formed by the patterning device. Since the patterning device used in the lithographic projection apparatus can be changed, it is desirable to separate the optical properties of the patterning device from the optical properties of the rest of the lithographic projection apparatus including at least the illumination and the projection optics. The objective of the simulation is often to accurately predict, for example, edge placements and CDs, which can then be compared against the device design. The device design is generally defined as the pre-OPC patterning device layout, and will be provided in a standardized digital file format such as GDSII or OASIS.

An aerial image 1230 can be simulated from the source model 1200, the projection optics model 1210 and the patterning device/design layout model 1220. An aerial image (AI) is the radiation intensity distribution at substrate level. Optical properties of the lithographic projection apparatus (e.g., properties of the illumination, the patterning device and the projection optics) dictate the aerial image.

A resist layer on a substrate is exposed by the aerial image and the aerial image is transferred to the resist layer as a latent "resist image" (RI) therein. The resist image (RI) can be defined as a spatial distribution of solubility of the resist in the resist layer. A resist image 1250 can be simulated from the aerial image 1230 using a resist model 1240. The resist model can be used to calculate the resist image from the aerial image, an example of which can be found in U.S. Patent Application Publication No. US 2009-0157360, the disclosure of which is hereby incorporated by reference in its entirety. The resist model typically describes the effects of chemical processes which occur during resist exposure, post exposure bake (PEB) and development, in order to predict, for example, contours of resist features formed on the substrate and so it typically related only to such properties of the resist layer (e.g., effects of chemical processes which occur during exposure, post-exposure bake and development). In an embodiment, the optical properties of the resist layer, e.g., refractive index, film thickness, propagation and polarization effects—may be captured as part of the projection optics model 1210.

So, in general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of incident energy, which is further modified by diffusion processes and various loading effects. Efficient simulation methods that are fast enough for full-chip applications approximate the realistic 3-dimensional intensity distribution in the resist stack by a 2-dimensional aerial (and resist) image.

In an embodiment, the resist image can be used as an input to a post-pattern transfer process model module 1260. The post-pattern transfer process model 1260 defines performance of one or more post-resist development processes (e.g., etch, development, etc.).

Simulation of the patterning process can, for example, predict contours, CDs, edge placement (e.g., edge placement error), etc. in the resist and/or etched image. Thus, the objective of the simulation is to accurately predict, for example, edge placement, and/or aerial image intensity slope, and/or CD, etc. of the printed pattern. These values can be compared against an intended design to, e.g., correct the patterning process, identify where a defect is predicted to occur, etc. The intended design is generally defined as a pre-OPC design layout which can be provided in a standardized digital file format such as GDSII or OASIS or other file format.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process.

Figure 14:
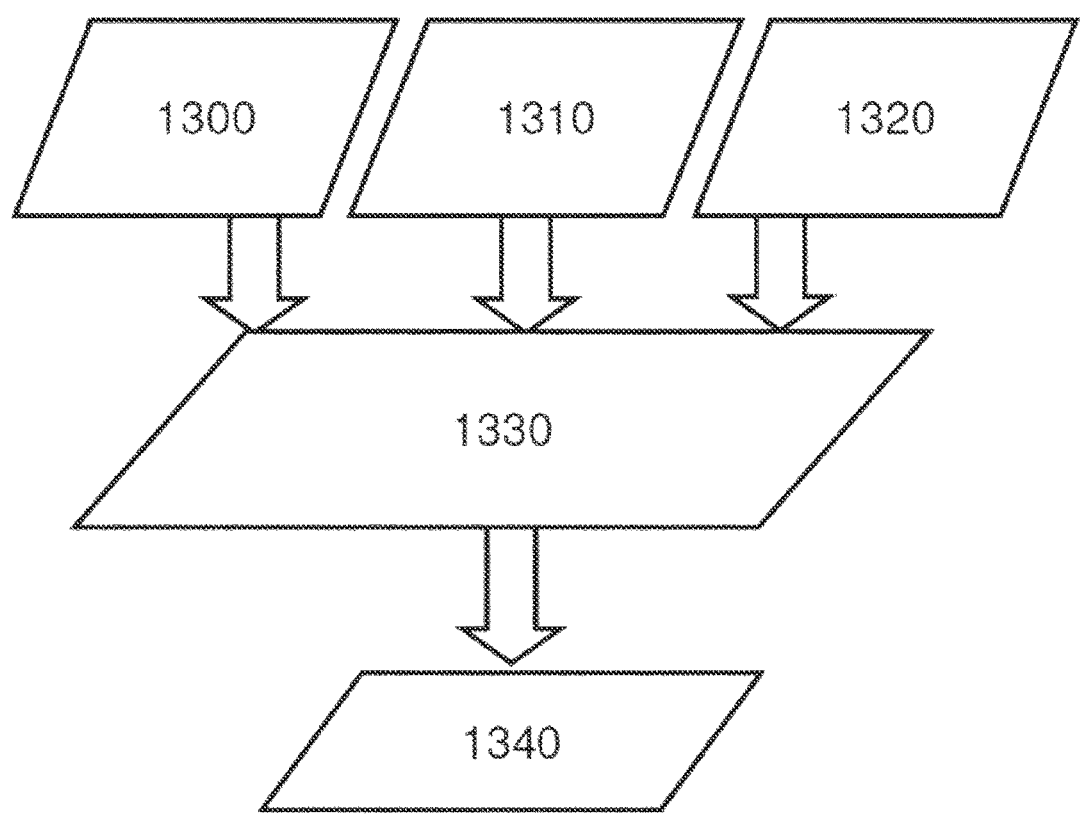
FIG. 14 schematically shows a flow for a method, according to an embodiment.

An exemplary flow chart for modelling and/or simulating a metrology process is illustrated in FIG. 14. As will be appreciated, the following models may represent a different metrology process and need not comprise all the models described below (e.g., some may be combined). A source model 1300 represents optical characteristics (including radiation intensity distribution, radiation wavelength, polarization, etc.) of the illumination of a metrology target. The source model 1300 can represent the optical characteristics of the illumination that include, but not limited to, wavelength, polarization, illumination sigma (σ) settings (where a σ (or sigma) is a radial extent of illumination in the illuminator), any particular illumination shape (e.g. off-axis radiation shape such as annular, quadrupole, dipole, etc.), etc.

A metrology optics model 1310 represents optical characteristics (including changes to the radiation intensity distribution and/or the phase distribution caused by the metrology optics) of the metrology optics. The metrology optics 1310 can represent the optical characteristics of the illumination of the metrology target by metrology optics and the optical characteristics of the transfer of the redirected radiation from the metrology target toward the metrology apparatus detector. The metrology optics model can represent various characteristics involving the illumination of the target and the transfer of the redirected radiation from the metrology target toward the detector, including aberration, distortion, one or more refractive indexes, one or more physical sizes, one or more physical dimensions, etc.

A metrology target model 1320 can represent the optical characteristics of the illumination being redirected by the metrology target (including changes to the illumination radiation intensity distribution and/or phase distribution caused by the metrology target). Thus, the metrology target model 1320 can model the conversion of illumination radiation into redirected radiation by the metrology target. Thus, the metrology target model can simulate the resulting illumination distribution of redirected radiation from the metrology target. The metrology target model can represent various characteristics involving the illumination of the target and the creation of the redirected radiation from the metrology, including one or more refractive indexes, one or more physical sizes of the metrology, the physical layout of the metrology target, etc. Since the metrology target used can be changed, it is desirable to separate the optical properties of the metrology target from the optical properties of the rest of the metrology apparatus including at least the illumination and projection optics and the detector. The objective of the simulation is often to accurately predict, for example, intensity, phase, etc., which can then be used to derive a parameter of interest of the patterning process, such overlay, CD, focus, etc.

A pupil or aerial image 1330 can be simulated from the source model 1300, the metrology optics model 1310 and the metrology target model 1320. A pupil or aerial image is the radiation intensity distribution at the detector level. Optical properties of the metrology optics and metrology target (e.g., properties of the illumination, the metrology target and the metrology optics) dictate the pupil or aerial image.

A detector of the metrology apparatus is exposed to the pupil or aerial image and detects one or more optical properties (e.g., intensity, phase, etc.) of the pupil or aerial image. A detection model module 1320 represents how the radiation from the metrology optics is detected by the detector of the metrology apparatus. The detection model can describe how the detector detects the pupil or aerial image and can include signal to noise, sensitivity to incident radiation on the detector, etc. So, in general, the connection between the metrology optics model and the detector model is a simulated pupil or aerial image, which arises from the illumination of the metrology target by the optics, redirection of the radiation by the target and transfer of the redirected radiation to the detectors. The radiation distribution (pupil or aerial image) is turned into detection signal by absorption of incident energy on the detector.

Simulation of the metrology process can, for example, predict spatial intensity signals, spatial phase signals, etc. at the detector or other calculated values from the detection system, such as an overlay, CD, etc. value based on the detection by the detector of the pupil or aerial image. Thus, the objective of the simulation is to accurately predict, for example, detector signals or derived values such overlay, CD, corresponding to the metrology target. These values can be compared against an intended design value to, e.g., correct the patterning process, identify where a defect is predicted to occur, etc.

Thus, the model formulation describes most, if not all, of the known physics and chemistry of the overall metrology process, and each of the model parameters desirably corresponds to a distinct physical and/or chemical effect in the metrology process.

The parameter maps of parameters (e.g., CD, OVL, Focus, EPE, defects, etc.) may vary in time, context (e.g., apparatus such as scanner, CMP, etching tool of the pattern process), and/or layer. The metrology tool having a fixed sampling scheme and fixed sampling layout of sample locations may fetch certain data in a sub-optimal fashion when a certain dense map is no longer captured optimally by the initial fixed sampling scheme. For example, a fixed sampling scheme may be utilized to perform measurements taken at certain locations of the substrate. Hence, a method for changing a sampling scheme dynamically is proposed according to the present disclosure.

Figure 15:
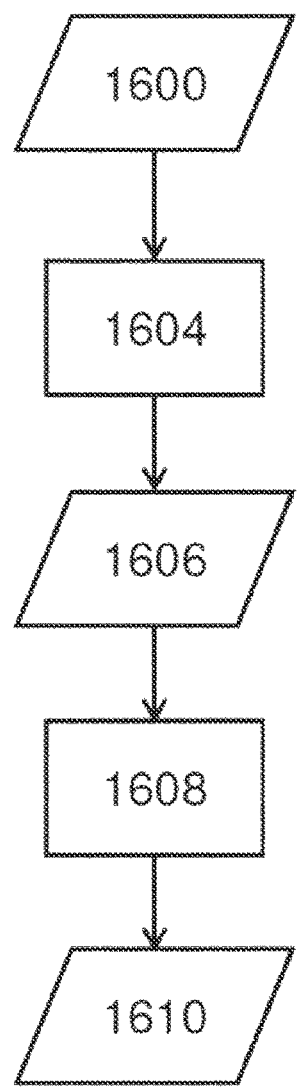
FIG. 15 schematically shows a flow for a method for generating a metrology sampling scheme for a patterning process, according to an embodiment.

FIG. 15 schematically shows a flow for a method for generating a metrology sampling scheme for a patterning process, according to an embodiment. A parameter map 1600 (also referred as a high density map or an overall finger print) can be obtained and/or generated from metrology data and data from one or more apparatus as discussed earlier in the disclosure. For example, the parameter map 1600 may be an overlay map, CD map, focus map, etc. or other maps related to parameter of the patterning process. In process 1604, the parameter map 1600 can be decomposed to generate and/or obtain individual fingerprints 1606 specific to a particular apparatus of the patterning process and/or a combination of tools of the patterning process. An example decomposition technique is discussed earlier in the disclosure, for example, with respect to FIGS. 8 and 9. Furthermore, in an embodiment, the decomposition can be based on statistical classification techniques such as principal component analysis (PCA), k-mean clustering, pattern matching, etc.

In process 1608, based on the individual fingerprint 1606 of an apparatus, a sampling scheme 1610 can be generated, by modelling and/or simulation, for a subsequent (i.e., next) substrate that will be processed at the apparatus and/or the combination of apparatuses corresponding to the individual fingerprint 1606. The sampling scheme 1610 can be configured to distribute sampling points on the next substrate so as to improve a metrology capture location and/or a metrology sampling density. A metrology capture location refers to a location on a substrate where metrology data is collected. A metrology sampling density refers to number of measurements per unit area taken around the metrology capture location. For example, when a first pattern layer of a substrate is processed by the patterning process, the metrology system in an apparatus (e.g., scanner) may have been measuring randomly across the substrate. However, after the first pattern layer, the fingerprint 1608 may indicate that the errors are concentrated around the edges. Then, for a subsequent (next) substrate or for a subsequent (next) pattern layer on the substrate, the metrology capture locations can be concentrated round the edges. Furthermore, the density of sampling points can also be modified. For example, 90% of allowed measurements can be focused along the edges. The sampling scheme 1610 results in more accurate model estimates, corrections to the apparatus, etc. Effectively, the sampling scheme 1610 or a progressively modified sampling scheme can reduce the errors in parameters of the patterning process faster than that with a fixed sampling scheme.

The sampling scheme 1610 can vary from one substrate to another substrate, and/or from one apparatus to another apparatus based on the individual fingerprint 1608. In an embodiment, the sampling scheme 1610 can vary from one apparatus to another for a substrate. Accordingly, one or more sampling schemes 1610 may be defined for the substrate based on the apparatus (e.g., scanner, etching tool, CMP, etc.) where the substrate is being or will be processed.

In an embodiment, for a given substrate the sampling scheme 1610 may be different at a next patterning cycle at the same apparatus. For example, initially metrology capture may be randomly distributed on the substrate. After a first patterning layer, the sampling scheme may be concentrated at the centre of the substrate due to higher error at the centre. Relatively more measurements at problematic regions enables accurate identification of issues related to patterning process, define higher order corrections and corresponding control of the apparatus. Hence, better patterning results can be obtained without exceeding the metrology constraints (i.e., number of measurements) while maintaining and/or improving the productivity of the patterning process.

In an embodiment, the process 1608 can generate the metrology sampling scheme 1610 based a comparison between an accuracy level of, for example, the parameter (e.g., CD) that can be achieved and an accuracy threshold (e.g., 2 nm) set for the parameter and/or patterning process. The accuracy level can be defined as a difference between the measurements of the parameter and computed parameter values represented by the parameter map. In an embodiment, the accuracy threshold can be user defined based on the experience of the user, limitations of the manufacturing process, metrology limitations, limitation of a computation model and/or simulation, etc. In response to not achieving the accuracy level, the process 1608 iteratively generates a different sampling scheme till the accuracy threshold or a benchmark accuracy is reached or breached. For example, the accuracy level is within at least 10% of the accuracy threshold. In an embodiment, accuracy level can be related to the computation model used to generate the parameter map. For example, the accuracy level can be a difference in the output of the computation model (i.e., parameter map) and the measurements taken on a patterned substrate In an embodiment, a benchmark accuracy level can be computed using a computation model and/or simulation that utilizes and/or generates a benchmark sampling scheme so as to cover the whole bandwidth of the signal in which the signal strength is higher than the noise of the metrology apparatus. Typically, the benchmark sampling scheme will have relatively more measurements than measurements during production to achieve high model accuracy. For example, the benchmark sampling scheme can include 10,000 measurements uniformly distributed across the substrate, which will most likely provide accurate depiction of condition of the substrate, capture several problematic regions of the patterning process, etc. However, such benchmark sampling may not be practical due to limitation of metrology tools and/or productivity limitations. In an embodiment, constraints on measurement can be, for example, up to 250 total measurements at an apparatus. The sampling scheme according to present disclosure, can distribute and/or redistribute these measurements (e.g., 250 in a first pass, 200 in a second pass, 150 in a third pass, 100 in a fourth pass, etc.) such that the accuracy level of the model of the parameter and/or patterning process is close to the benchmark accuracy. Hence, even with relatively less measurements, a desired accuracy level can be achieved.

Once the sampling scheme is generated, the method may further include process for operating a metrology tool (e.g., as discussed with respect to FIGS. 1-4) configured and arranged to take measurements at the sampling points based on the sampling scheme. For example, operating the metrology tool includes directing an illumination/radiation beam to a sampling point of the sampling scheme, adjusting an optical element, moving a substrate table with respect to the metrology tool, etc. followed by taking measurements at the sampling points. Furthermore, based on the measurements, a process of adjusting the apparatus of the patterning process and performing a patterning transfer process may be performed. As the sampling scheme improves the distribution of metrology locations, the patterning process may effectively print patterns on the substrate at a faster rate (less measurement overhead) with a high yield (or less errors) compared to printing patterns where the metrology tool is configured to make measurements based on a fixed sampling scheme.

Figure 16A:
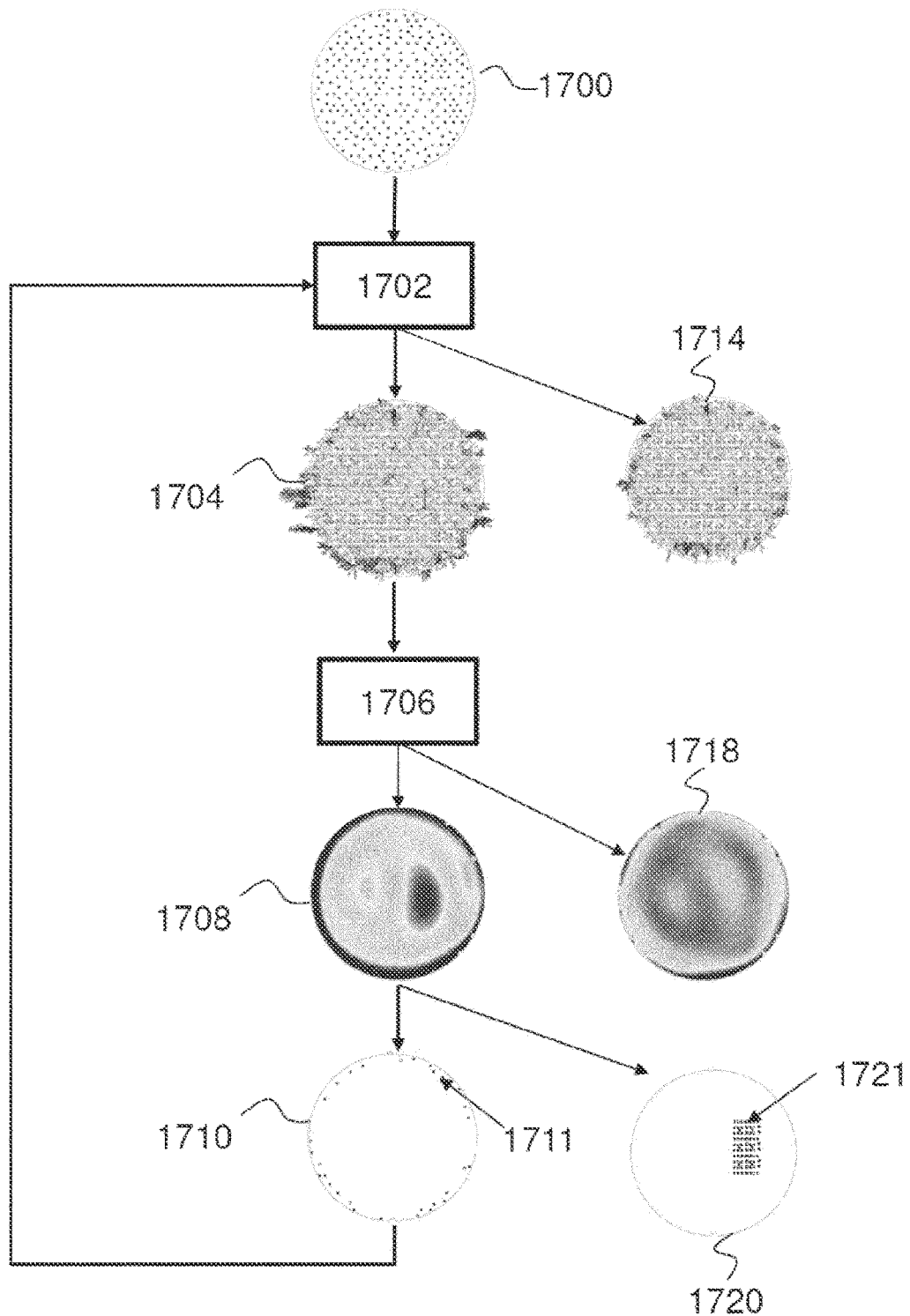
FIG. 16A schematically shows a flow for another method for generating a metrology sampling scheme for a patterning process, according to an embodiment.

In an embodiment, the sampling scheme can be defined based on known and unknown contributors of the patterning process as discussed with respect to FIG. 16A. The process starts when metrology data 1700 for a substrate is obtained or received. The metrology data 1700 can be measurements corresponding to a first sampling scheme for the substrate and/or a tool of the pattering process. In process 1702, based on the metrology data 1700, a parameter map 1704 can be obtained and/or generated for the substrate. The parameter map 1704 refers to the high-density map of the parameter generated from the metrology data and the apparatus data, as discussed earlier in the disclosure. For example, the parameter map 1704 can be an overlay map, a CD map, edge placement error map, or maps related to other parameters of the patterning process.

In process 1706, a contributor (also referred as identified contributor or known contributor hereinafter) of the parameter map 1704 can be obtained and/or determined, for example, based on the methods as discussed earlier. For example, the known contributor may be a first contributor (e.g., dose of a first apparatus), a second contributor (e.g., focus of a first or second apparatus), etc. Further, in process 1706, contributions of the known contributor can be removed to generate a residual map 1708. The residual map 1708 identifies remaining contributions from unknown contributors (i.e., contributors other than the known or identified contributors). Based on the residual map 1708, a statistical analysis such as PCA, k-means clustering, or other classification techniques can be performed to identify the unknown contributors. In an embodiment, a known contributor can be determined using one or more statistical classification techniques that can identify a set of category to which an observation or measurement belong to. For example, the classification technique can be Principal Component Analysis (PCA), cluster analysis, discriminant analysis, etc. An example of PCA technique is discussed with respect to FIG. 16B later in the disclosure. In an embodiment, the categories can be based on a metrology constraint analysis of the metrology tools. For example, the metrology constraint can be 200 measurements at an apparatus (e.g., the scanner) and 100 measurements at another apparatus (e.g., the etching tool). Then, substrates that will be processed at the apparatus (e.g., the scanner) can be categorized in one category and the substrates that will be processed at another apparatus (e.g., the etching tool) can be grouped in a second category.

For example, the residual map 1708 depicts contributions from two previously unknown contributors (which are revealed after the classification analysis). For example, a first contributor is indicated by a dark region along the edge and a second contributor is indicated by a dark region at a centre of the substrate.

Based such residual map 1708, a second sampling scheme can be defined and/or generated. For example, for the first contributor, a sampling scheme 1710 can include sampling points 1711 distributed along the edge of the substrate. Similarly, for the second contributor, a different sampling scheme 1720, can include sampling points 1721 distributed approximately at the centre, as shown. Such sampling schemes 1710 and 1720 can effectively capture contributions from unknown sources and progressively reduce the errors in the fingerprint of the substrate.

In an embodiment, based on the known contributor(s), a dominant contributor can be obtained and/or identified. The dominant contributor being any tool or a combination of tools of the patterning process having a relatively high contribution within the parameter map 1704. Then, a sampling scheme can be based on the dominant contributor. For example, more sampling points can be used for dominant contributor and for other relatively less contributors; less sampling point or no sampling points may be included. In an embodiment, the sampling scheme defines a relatively high metrology sampling density at the defined metrology capture location, as discussed earlier with respect to FIG. 15.

Further, an accuracy level of the model of a parameter and/or patterning process can be obtained and/or determined as a difference between the measurements of the parameter and computed parameter values represented by the parameter map. In an embodiment, the accuracy threshold can be predetermined, for example, less than 2 nm. In response to not achieving the accuracy level, the process 1608 iteratively identifies different contributors based on residual maps and generates a different sampling scheme till the accuracy threshold or a benchmark accuracy is reached or breached. For example, the accuracy level is within at least 10% of the accuracy threshold.

Figure 16B:
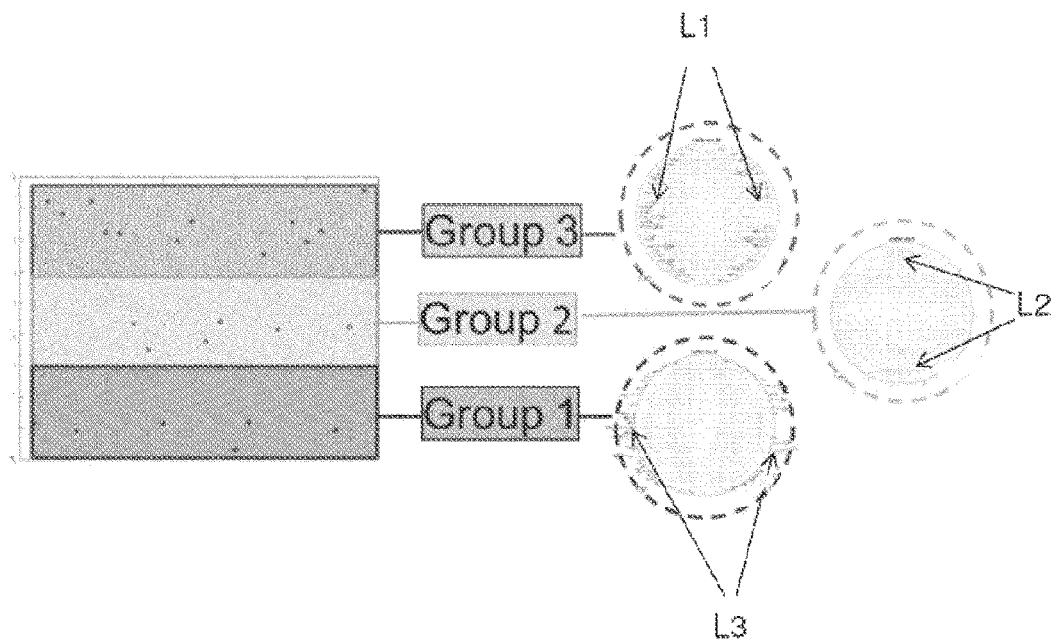
FIG. 16B illustrates an example of the principal component analysis, according to an embodiment.

FIG. 16B illustrates an example of the principal component analysis, according to an embodiment. In FIG. 16B, principal component analysis is performed on parameter map obtained for several wafers (e.g., 25 wafers). The principal component analysis identifies different groups (e.g., group 1, group 2, and group 3) of wafers having similar characteristics. For example, a first group (e.g., group 1) of wafers may follow similar path in the pattern process, where all the wafers in the group 1 may visit a first etch chamber. Similarly, a second group (e.g., group 2) of wafers may follow similar path in the pattern process, where all the wafers in the group 2 may visit a first CMP and a second etch chamber. In another example, a third group (e.g., group 3) of wafers may follow similar path in the pattern process, where all the wafers in the group 3 may visit a second CMP and the first etch chamber.

Based on the identified groups and their corresponding parameter maps, a first, a second and a third sampling scheme can be defined for the group 1, the group 2 and the group 3 wafers, respectively. For example, the first sampling scheme for the group 1 can distribute sampling points with a higher density along a first location L1 (e.g., on an inner side of the right and the left portions of the edge of the wafer in the group 1, as shown). The second sampling scheme for the group 2 can distribute sampling points with a higher density along a second location L2 (e.g., a top and a bottom portion of the edge of the wafer in the group 2, as shown). And the third sampling scheme for the group 3 can distribute sampling points with a higher density along a third location L3 (e.g., on an outer side of the right and the left portions of the edge of the wafer in the group 3, as shown).

It can be appreciated that the data 1700, 1711, 1721 and the parameter maps 1704, 1708, 1714, 1718 and other substrate related data shown in FIGS. 16A and 16B are examples for purposes of illustration and clarity in understanding, and do not intend to limit the scope of the present disclosure.

Figure 17A:
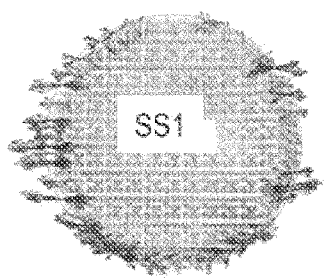
FIG. 17A-17E illustrates an example effect of change in a sampling scheme based on the method in FIGS. 15 and 16A-16B, according to an embodiment.
Figure 17B:
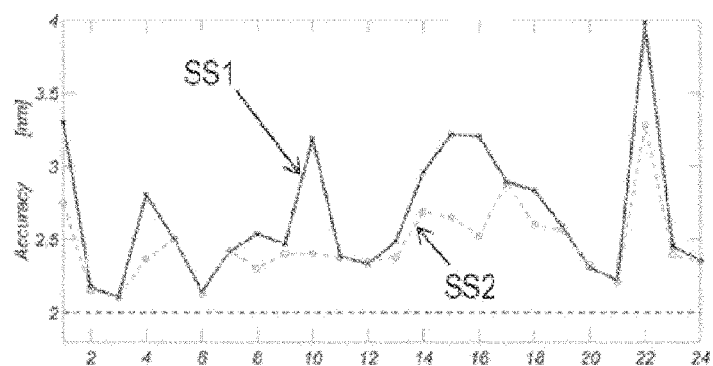
Figure 17C:
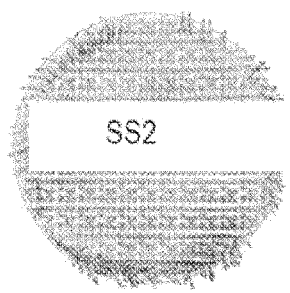
Figures 17D, 17E:
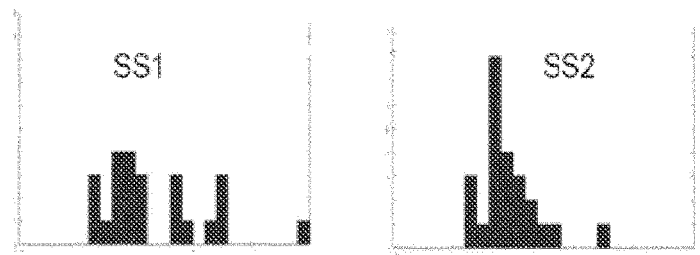

FIGS. 17A-17E illustrates an example effect of change in a sampling scheme based on the method in FIGS. 16 and 17, according to an embodiment. In FIG. 17A, an initial sampling scheme SS1 is used for performing metrology that remains fixed for all the substrates (also referred as wafers). For example, the initial sampling scheme SS1 captures metrology all around the edge of a wafer for each wafer. Such fixed sampling scheme SS1 has a varied effect on the accuracy of the computational metrology, as shown in FIG. 17B. For example, in FIG. 17B, the accuracy for $3^{rd}$ wafer is approximately 2.1 nm vs the accuracy of a $22^{nd}$ wafer is approximately 4 nm. Also, FIG. 17D shows that the accuracy level varies significantly from wafer to wafer.

However, the accuracy level of the computation model of the parameter and/or patterning process improves for a dynamic sampling scheme defined according to the methods of FIGS. 16 and 17. For example, FIG. 17C illustrates a sampling scheme SS2 where a relatively high metrology capture is concentrated towards a bottom edge of the wafer. Furthermore, the sampling scheme SS2 may or may not be used to other wafers. A new sampling scheme may be defined for other wafers as discussed earlier in FIGS. 16 and 17. As such, the accuracy level of the computation metrology increases. For example, in FIG. 17B, the accuracy level for several wafers is close to approximately 2.1 nm. Also, as shown in FIG. 17E, the accuracy level does not vary significantly from wafer to wafer. As such, the sampling scheme defined according to the methods of the present disclosure substantially improves the quality and trustworthiness of the measurements. Additionally, the measurements are more appropriately distributed at problematic regions of the wafer instead of uniformly and/or randomly distributing the sampling over the wafer. Accordingly, relatively smaller number of measurements may be taken on one or more wafers by the metrology tools while maintaining and/or improving the accuracy level of the computational metrology. Consequently, less measurement by the metrology tool can further improve the throughput of the patterning process while increasing the accuracy.

Spatial frequency characteristics of wafer-to-wafer (or field-to-field) variation may not be properly represented by present metrology sampling. Presently, metrology key performance indicators (KPIs) are insufficient for indicating the dominant and correlated spatial frequency characteristics within average and wafer-to-wafer variations. As such, in pattern fidelity control (PFC) and edge placement error (EPE) control, suitable KPIs and an analytical methodology are presently unavailable which are able to illustratively indicate which layers, process steps and/or contributors dominate variation in a parameter of interest at wafer-to-wafer level. In this embodiment, a correlation metric, more specifically a spatial frequency based correlation density spectrum, is proposed, which can be used to define one or more such KPIs. In particular, methods for determining a sampling optimization for capturing dominant variations at wafer-to-wafer level, will be described. The method enables identification of one or more dominant contributors in these variations/distributions at wafer-to-wafer level. Additionally, the methods may be applicable on a per-layer basis, to enable identification of any dominant frequency content (e.g., overlay or edge placement error) which propagates through process stacks. By using such methods, spatial characteristics of measured wafer-to-wafer parameter variations can be derived, and the dominance of certain spatial frequencies determined. Less important contributors associated with less dominant spatial frequencies can be filtered out to substantially reduce noise within the metrology data. The filtered metrology data may be used for various purposes, in addition to deriving a better sampling scheme customized for determining the more dominant parameter variations between the wafers.

Figure 18:
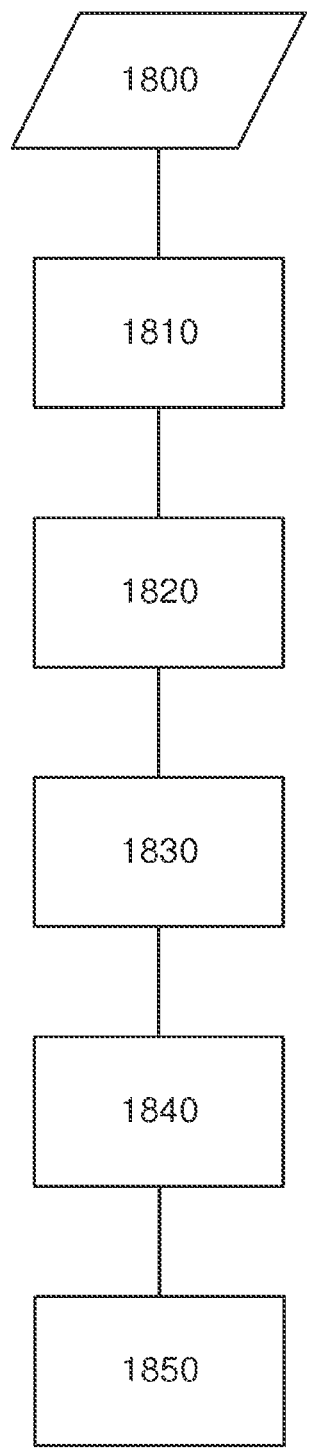
FIG. 18 schematically shows a flow for a method, according to an embodiment.

FIG. 18 is a flow chart of a method of an embodiment for deriving a suitable KPI for process and patterning control at wafer-to-wafer or field-to-field level, which will be referred to herein as Correlation Density Spectra (CDS). Input data 1800 may comprise measurements of a process parameter of interest; the example here will refer to overlay measurements, although the methods are equally applicable to other process parameters, e.g., CD or EPE. An initial (optional) filtering step 1810 may be performed which comprises removing average per-chuck content from the input data 1800. At step 1820, pairs of subsets of the input data are selected (e.g., randomly) and their radial/tangential or X/Y components calculated. The data subsets may comprise subsets of data each relating to a different wafer or to a different field, for example, such that each subset pair relates to a pair of wafers, or a pair of fields (from the same wafer or different wafers). At step 1830, spatial frequency spectra are derived from the filtered input data, each spectrum comprising a magnitude for the process parameter (e.g., overlay error) plotted against the spatial frequency. At step 1840, a cross-correlation (i.e., a correlation spectrum) for the pairs of the spatial frequency spectra are determined. This may be done for each pair, analogously to the convolution theorem, by multiplying the two spatial frequency spectra together (e.g., using complex multiplication). For example, the pairs of spatial frequency spectra may correspond to some or all of the wafers being measured. More specifically, a subset of the wafers of a lot may be selected (e.g., randomly) and a cross-correlation spectrum determined for each possible pair combination of the subset of wafers. Alternatively the cross-correlation spectra may be determined at a field level, for pairs of fields. At step 1850, a distribution of the correlation (a Correlation Density Spectrum) at each spatial frequency is determined. In an embodiment, this comprises determining the magnitude of each cross-correlation spectrum, with the Correlation Density Spectra (CDS) defined as a distribution of the magnitude of the correlation spectra per spatial frequency. CDS can be determined for a specific component (radial/tangential or X/Y) of a pair of wafers/fields. That is, given two wafers (or fields), their radial or tangential CDS can be determined.

From the CDS, a correlation metric can be defined as a KPI having a number of uses. For example, the correlation metric may be an average (e.g., mean) of the CDS distributions at each spatial frequency. Each mean CDS value can be used as an indicator of the probability that its corresponding spatial frequency is present wafer-to-wafer. A large mean CDS at a spatial frequency indicates that this frequency is dominant at a wafer-to-wafer level and may have a root cause (note that each spatial frequency is orthogonal by definition). A large mean CDS can also be taken as an indication that the corresponding frequency should be sampled, and therefore can be used as a basis for determining a sampling scheme.

In another example, a large standard deviation of the CDS at a spatial frequency indicates that the spatial frequency is widely varying between pairs of wafers, such that for some pairs it is more dominant than others. This indicates that at this frequency wafer pairs may be grouped and the grouping investigated further (for example, linking the groups to context, such as processing history—e.g., which scanner and/or etch chamber was used to process the wafers). Grouping may be achieved by any suitable clustering algorithm, for example.

Figure 19:
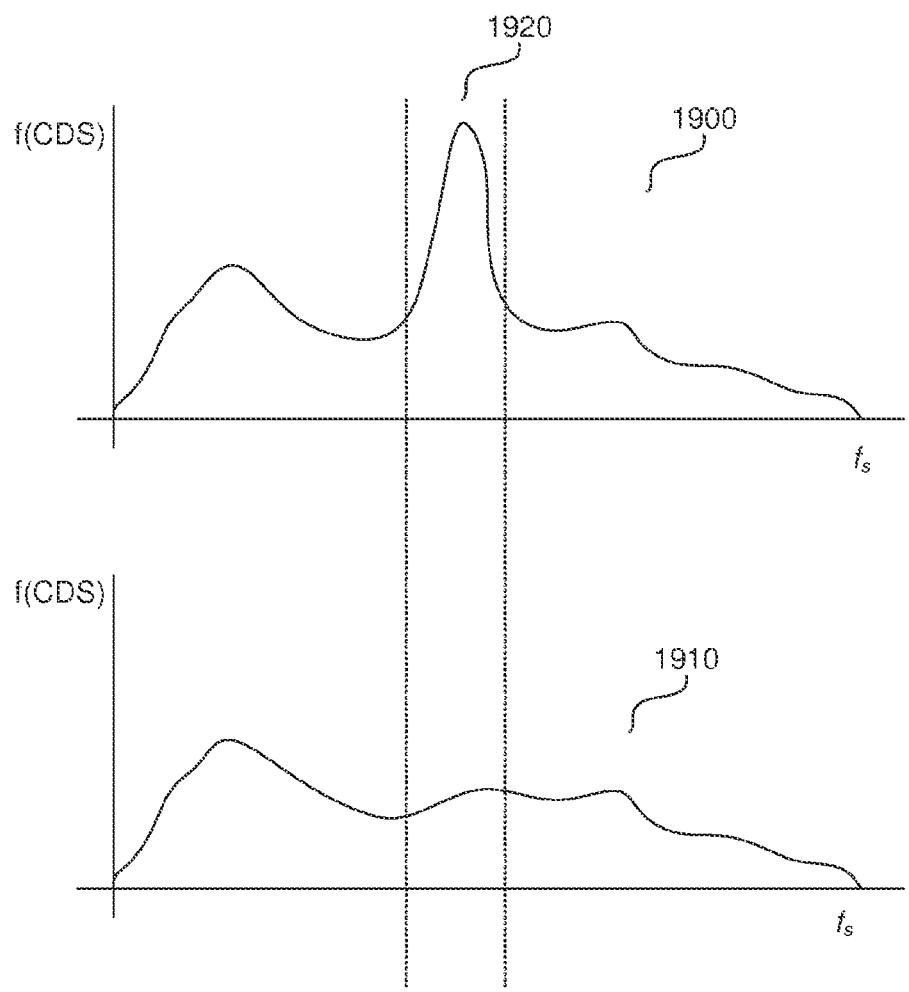
FIG. 19 schematically shows two correlation metrics each relating to a different layers, illustrating variation in dominant spatial frequencies between layers.

It is further proposed that, in an embodiment, the correlation metric can be determined for all (or a subset) of layers in a stack; i.e., defined on a per-layer basis. In this way, the CDS can be used to define one or more correlation metrics (KPIs) for identifying which layer in the process stack dominates the wafer-to-wafer variation at a particular spatial frequency or for particular spatial frequency windows. This information can be used as an indicator to determine a metrology sampling scheme optimized for each layer and overlay fingerprint. FIG. 19 illustrates such an approach. It shows a plot of the spatial frequency $f_s$ on the x axis and a function of CDS (f(CDS)), e.g., a CDS metric such as mean or 3σ, on the y axis. A first correlation metric 1900 is determined for a first layer of a stack and a second correlation metric 1910 is determined for a second layer of the stack. A region of one or more dominant spatial frequencies 1920 is apparent in the first correlation metric which is absent in the second correlation metric. As such, the sampling scheme can be optimized for both correlation metrics. For example, a sampling scheme for the first layer may have increased sampling at the area corresponding to the dominant spatial frequencies 1920.

Figure 20:
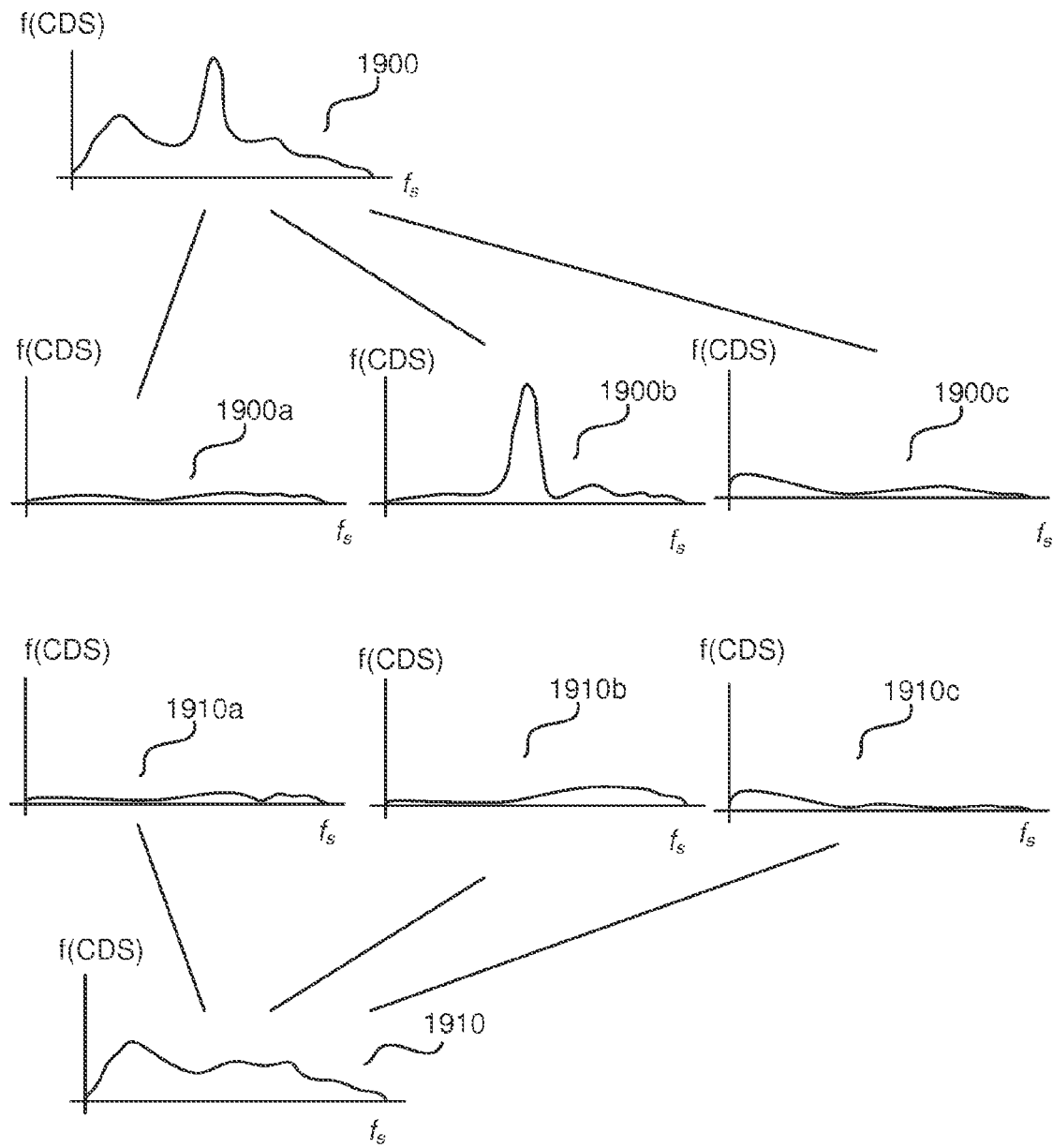
FIG. 20 schematically shows contributor correlation metrics related to the two correlation metrics of FIG. 19.

FIG. 20 illustrates a further embodiment where data is available to derive contributors from processing data. The processing data may be related to a particular context (e.g., particular scanner or etch chamber used, for example), and be sufficient for determining contributors to observed dominant effects. FIG. 20 shows the first Correlation metric 1900 and second Correlation metric 1910 from FIG. 19, and contributor correlation metrics 1900*a*, 1900*b*, 1900*c*, 1910*a*, 1910*b*, 1910*c* derived from the processing data, where contributor correlation metrics 1900a, 1900b, 1900c relate to formation/processing of the first layer and 1910a, 1910b, 1910c relate to formation/processing of the second layer. The processing data may comprise data measured by scanner (e.g., alignment data) and/or inline metrology using a scatterometer or other meteorology device, from computational metrology or relating to another different metrology input in, for example, EPE re-construction. In each case, the processing data should have a related context (e.g., relate to a particular apparatus or process, such that a contributor correlation metric can be defined using processing data of the same context). By way of example, contributor correlation metrics 1900a, 1900b, 1900c might relate to alignment data from respective different scanners, or from metrology data following etching by respective different etch chambers. The actual determination of the correlation metric is according to already described previously by FIG. 18, where the processing data is the input data 1800. In particular, a main contributor 1900b to the dominant spatial frequencies of the first correlation metric 1900 can be observed in the figure. The contributor correlation metric can be used for root cause determination and/or as an indicator to trigger actions for control of a particular control parameter (e.g., of a particular apparatus or process relating to the contributor (s) context identified). For example, if contributor correlation metric 1900b relates to a particular etch chamber, then its identification as a dominant contributor can be used as a trigger for a corrective control action for that etch chamber (to improve processing of that layer) in a feedback loop and/or to provide feedforward correction to subsequent layers and/or processes to compensate.

It is also proposed that the frequencies which are identified to be insignificant (significantly non-dominant), may be filtered out as noise. This will help modeling performance. A noise threshold can be set, and the methods described herein used as a noise filter.

In summary, a method for processing a plurality of wafers is disclosed. The method comprises: a) obtaining metrology data relating to the plurality of wafers; b) determining a property of the metrology data based on variation of the metrology data between one or more pairs of said plurality of wafers; and c) using the property to perform one or more of: determine a sampling scheme configured for future metrology measurements, identify groups of similarity within the plurality of wafers, determine a KPI of the processing, correlate the metrology data to context and/or processing data, filter out noise from the metrology data.

Such a method enables, for example, metrology sampling schemes to be optimized per layer through the stack instead of using a pre-defined sampling scheme per layer, to trigger metrology actions for verifying contributors via direct measurements or context finding, and/or to trigger feedback/feedforward actions in process control to avoid disturbance through the stack.

Figure 21:
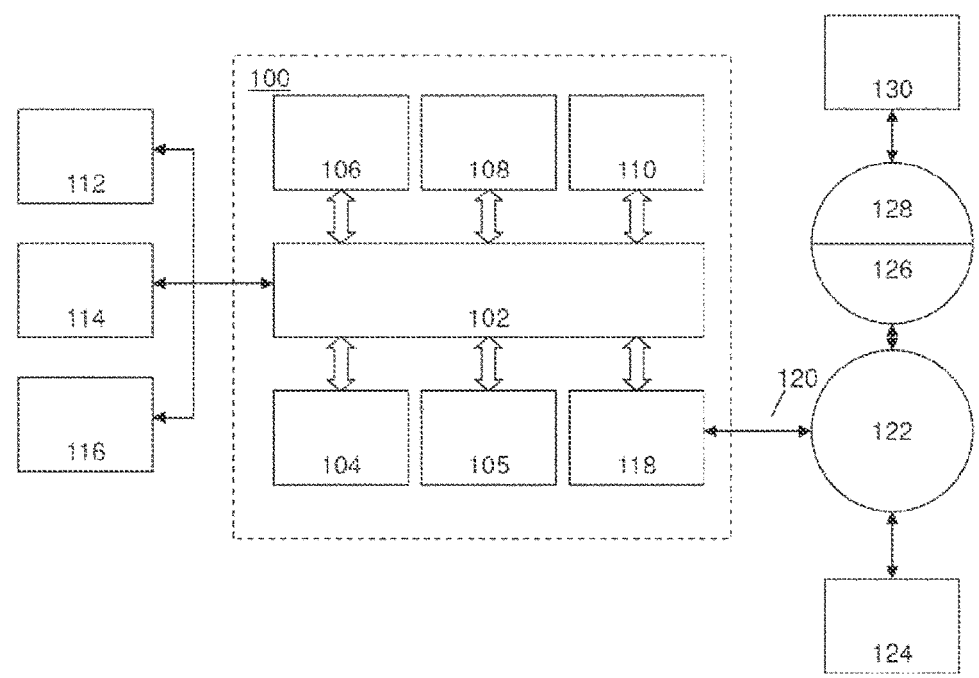
FIG. 21 is a block diagram of an example computer system.

FIG. 21 is a block diagram that illustrates a computer system 100 which can assist in implementing methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to an embodiment, portions of the process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also desirably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are example forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to cost constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

Further embodiments of the inventions are disclosed in the list of numbered embodiments below:

1. A method for generating metrology sampling scheme for a patterning process, the method comprising:
   obtaining a parameter map of a parameter of a patterning process for a substrate;
   decomposing, by a hardware computer system, the parameter map to generate a fingerprint specific to an apparatus of the patterning process and/or a combination of apparatuses of the patterning process; and
   based on the fingerprint, generating, by the hardware computer system, a metrology sampling scheme for a subsequent substrate at the apparatus of the patterning process and/or the combination of apparatuses of the patterning process, wherein the sampling scheme is configured to distribute sampling points on the subsequent substrate so as to improve a metrology sampling density.

2. The method of embodiment 1, wherein the generating the metrology sampling scheme comprises distributing sampling points, by modelling and/or simulation, on the substrate such that an accuracy level of the parameter is less than or equal to an accuracy threshold of the parameter of the patterning process.

3. The method of embodiment 2, further comprising:
   comparing, by the hardware computer system, the accuracy level of the parameter achieved using the metrology sampling scheme with a benchmark accuracy achieved using a benchmark sampling scheme; and
   in response to not achieving the accuracy level, iteratively generating a different sampling scheme till the benchmark accuracy is reached or breached.

4. The method of embodiment 3, wherein the benchmark sampling scheme is configured to minimize an uncertainty of a model used to generate the parameter map.

5. The method of embodiment 1, further comprising:
   operating a metrology tool configured and arranged to take measurements at the sampling points based on the metrology sampling scheme; and
   based on the measurements, determining, by modelling and/or simulation an adjust to the apparatus of the patterning process and performing a patterning transfer process.

6. The method of embodiment 5, wherein the operating the metrology tool comprises directing an illuminating beam to a sampling point of the sampling scheme and taking measurements.

7. The method of embodiment 5, wherein the decomposing parameter map is performed using a k-mean clustering and/or principal component analysis technique.

8. A method for generating metrology sampling scheme for a patterning process, the method comprising:
   obtaining data corresponding to a first sampling scheme for a substrate and/or an apparatus of a pattering process, and a parameter map corresponding to the obtained data;
   identifying, by a hardware computer system, a contributor of the parameter map;
   removing, by the hardware computer system, a contribution of the contributor from the parameter map to generate a residual map; and
   generating, by modelling and/or simulation, a second metrology sampling scheme based on the residual map, wherein the second metrology sampling scheme is configured to distribute sampling points on the subsequent substrate so as to improve a metrology sampling density.

9. The method of embodiment 8, wherein the generating the second sampling scheme comprises distributing sampling points, by modelling and/or simulation, on the substrate such that an accuracy level of the parameter is less than or equal to an accuracy threshold of the parameter of the patterning process.

10. The method of any of embodiments 8-9, wherein the generating the second sampling scheme comprises defining a metrology capture location at a portion of an edge of the subsequent substrate based on the identified contributor.

11. The method of any of embodiments 8-10, wherein the generating the second sampling scheme comprises defining a metrology capture location at and/or around a centre of the subsequent substrate based on the identified contributor.

12. The method of any of embodiments 8-11, wherein the generating the second sampling scheme comprises assigning relatively high number of sampling points within the metrology capture location compared to remaining locations of the subsequent substrate.

13. The method of embodiment 6, wherein the contributor is a dominant contributor, the dominant contributor being any apparatus or a combination of apparatuses of the patterning process having a relatively high contribution to the parameter within the parameter map.

14. The method of embodiment 13, wherein the identifying of the contributor comprises applying a statistical classification technique to the parameter map.

15. The method of embodiment 14, wherein the statistical classification technique is principal component analysis.

16. The method of any of embodiments 8-15, further comprising:
    operating a metrology tool configured and arranged to take measurements at the sampling points based on the second sampling scheme; and
    based on the measurements, adjusting the apparatus of the patterning process and performing a pattern transfer process.

17. The method of embodiment 16, wherein the operating the metrology tool comprises directing an illuminating beam to a sampling point of the second sampling scheme and taking measurements.

18. The method of any of embodiments 8-17, further comprising:
    determining, by the hardware computer system, whether an accuracy threshold of the parameter is reached based on the residual map; and
    in response to not reaching the accuracy level, iteratively generating a different sampling scheme based on the residual map till the benchmark accuracy is reached or breached.

19. The method of any of embodiments 8-18, wherein the accuracy threshold of the parameter is less than 2 nm.

20. The method of any of embodiments 8-19, wherein the second sampling scheme defines a relatively high metrology sampling density at the defined metrology capture location compared to other locations within the substrate.

21. A method for controlling a semiconductor manufacturing process comprising:
    obtaining process parameter data relating to a plurality of substrates;
    determining a property of the process parameter data based on variation of the process parameter data between one or more pairs of subsets of the process parameter data; and
    using the property of the process parameter data to perform one or more of: determine a sampling scheme configured for future metrology measurements to obtain further process parameter data, identify groups of similarity within the plurality of substrates, determine a KPI of the processing, correlate the metrology data to context and/or processing data, filter out noise from the process parameter data.

22. The method of embodiment 21, wherein the method comprises the steps of:
    determining a correlation frequency spectra between different pairs of spatial frequency spectra, each pair relating to a different pair of substrates,
    determining a distribution of the magnitude of correlation frequency spectra per spatial frequency, and determining a correlation metric from the distribution of the magnitude of correlation frequency spectra per spatial frequency.

23. The method of embodiment 22, wherein each of the subsets of the process parameter data relates to a different one of the plurality of substrates, or fields thereof.

24. The method of embodiment 22 or 23, wherein the correlation metric comprises an average of the distribution.

25. The method of embodiment 22, 23 or 24, comprising using the correlation metric to determine the significance of spatial frequencies in the process parameter data.

26. The method of embodiment 25, comprising filtering out as noise, one or more spatial frequencies deemed to be insignificant.

27. The method of embodiment 25 or 26, comprising optimizing the sampling scheme for correction of one or more spatial frequencies deemed most significant.

28. The method of embodiment 27, comprising determining a correlation metric for a plurality of layers of a semiconductor manufactured by the semiconductor manufacturing process, and
optimizing the sampling scheme separately for each of these layers.

29. The method of any of embodiments 22 to 28, wherein the process parameter data is grouped by context, said method comprises
determining said correlation metric for each context;
using the context based correlation metric to identify one or more dominant contributor contexts.

30. The method of embodiment 22, wherein the correlation metric comprises a standard deviation of the distribution.

31. The method of embodiment 30, comprising identifying one or more spatial frequencies having a large standard deviation, and identifying groups of similarity within the plurality of substrate at these spatial frequencies.

32. The method of any of embodiments 8-31, wherein the parameter of the patterning process is an overlay, a critical dimension, a focus, and/or an edge placement error.

33. A method for generating a metrology sampling scheme for a patterning process, the method comprising:
obtaining data comprising a parameter map of values of a parameter corresponding to a first metrology sampling scheme for a substrate subject to the patterning process;
identifying, by a hardware computer system, a contributor of the parameter map, wherein said contributor comprises one or more spatial frequencies identified in the data;
removing, by the hardware computer system, a contribution of the contributor to the parameter map to generate a residual map; and
generating, by modelling and/or simulation, a second metrology sampling scheme based on the residual map, wherein the second metrology sampling scheme is configured to distribute sampling points on a subsequent substrate so as to improve a metrology sampling density.

34. The method of claim 33, wherein the generating the second metrology sampling scheme comprises distributing sampling points, by modelling and/or simulation, on the subsequent substrate such that an accuracy level of the parameter is less than or equal to an accuracy threshold of the parameter of the patterning process.

35. The method of claim 33, wherein the generating the second metrology sampling scheme comprises defining a metrology capture location at a portion of an edge of the subsequent substrate based on the identified contributor.

36. The method of claim 35, wherein the generating the second metrology sampling scheme comprises assigning relatively high number of sampling points within the metrology capture location compared to remaining locations of the subsequent substrate.

37. The method of claim 33, wherein the generating the second metrology sampling scheme comprises defining a metrology capture location at and/or around a centre of the subsequent substrate based on the identified contributor.

38. The method of claim 33, wherein the contributor is a dominant contributor, the dominant contributor being any apparatus or a combination of apparatuses used in the patterning process having a relatively high contribution to the parameter map.

39. The method of claim 33, wherein the identifying of the contributor comprises applying a statistical classification technique to the parameter map.

40. The method of claim 39, wherein the statistical classification technique is a principal component analysis.

41. The method of claim 33, wherein the removal step comprises removing at least one of the one or more spatial frequencies identified as being less dominant.

42. The method of claim 41, wherein the method comprises the steps of:
determining a correlation frequency spectra between different pairs of spatial frequency spectra, each pair relating to a different pair of substrates or fields thereof;
determining a distribution of the magnitude of correlation frequency spectra per spatial frequency;
determining a correlation metric from the distribution of the magnitude of correlation frequency spectra per spatial frequency; and
using the correlation metric to generate the second metrology scheme.

43. The method of claim 33, further comprising:
determining, by the hardware computer system, whether an accuracy threshold of the parameter is reached based on the residual map; and
in response to not reaching the accuracy level, iteratively generating a different sampling scheme based on the residual map till the benchmark accuracy is reached or breached.

44. The method of claim 33, wherein the parameter of the patterning process is an overlay, a critical dimension, a focus, and/or an edge placement error.

45. The method of claim 33, further comprising:
configuring a metrology tool to take measurements at sampling points based on the second metrology sampling scheme; and
based on the measurements, adjusting an apparatus used in the patterning process.

46. The method of claim 45, further comprising operating the metrology tool by directing an illuminating beam to a sampling point of the second metrology sampling scheme and taking measurements.

47. A computer program product comprising a non-transitory computer readable medium having instructions recorded thereon, the instructions when executed by a computer implementing the method of claim 33.

48. A computer program product comprising a non-transitory computer readable medium having instructions recorded thereon, the instructions when executed by a computer implementing the method of any of the embodiments 1-47.

It should be understood that the description and the drawings are not intended to limit the invention to the particular form disclosed, but to the contrary, the intention is to cover all modifications, equivalents, and alternatives falling within the spirit and scope of the present invention as defined by the appended claims.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed, change in order or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

While specific embodiments of the disclosure have been described above, it will be appreciated that the embodiments may be practiced otherwise than as described.

What is claimed is:

1. A method comprising:
   obtaining process parameter data relating to a plurality of substrates of a semiconductor manufacturing process;
   determining, by a hardware computer system, a property of the process parameter data based on variation of the process parameter data between one or more pairs of subsets of the process parameter data; and
   using the property of the process parameter data to one or more selected from: determine a sampling scheme configured for future metrology measurements to obtain further process parameter data, identify groups of similarity within the plurality of substrates, determine a key performance indicator of the processing, correlate the metrology data to context and/or processing data, and/or filter out noise from the process parameter data.

2. The method of claim 1, further comprising:
   determining a correlation frequency spectra between different pairs of spatial frequency spectra, each pair relating to a different pair of substrates;
   determining a distribution of a magnitude of correlation frequency spectra per spatial frequency; and
   determining a correlation metric from the distribution of the magnitude of correlation frequency spectra per spatial frequency.

3. The method of claim 2, wherein the correlation metric comprises an average of the distribution.

4. The method of claim 2, further comprising using the correlation metric to determine the significance of spatial frequencies in the process parameter data.

5. The method of claim 4, comprising using the property of the process parameter data to filter out noise from the process parameter data and comprising filtering out as noise, one or more spatial frequencies deemed to be insignificant.

6. The method of claim 4, comprising using the property of the process parameter data to determine a sampling scheme configured for future metrology measurements to obtain further process parameter data and further comprising optimizing the sampling scheme for correction of one or more spatial frequencies deemed most significant.

7. The method of claim 6, comprising:
determining a correlation metric for a plurality of layers of a semiconductor substrate manufactured by the semiconductor manufacturing process, and
optimizing the sampling scheme separately for each of these layers.

8. The method of claim 2, wherein the process parameter data is grouped by context, and comprising:
determining the correlation metric for each context; and
using the context based correlation metric to identify one or more dominant contributor contexts.

9. The method of claim 2, wherein the correlation metric comprises a standard deviation of the distribution.

10. The method of claim 9, comprising using the property of the process parameter data to identify groups of similarity within the plurality of substrates, further comprising identifying one or more spatial frequencies having a large standard deviation, and comprising identifying groups of similarity within the plurality of substrate associated with these spatial frequencies.

11. The method of claim 1, wherein each of the subsets of the process parameter data relates to a different one of the plurality of substrates, or fields thereof.

12. The method of claim 1, wherein the process parameter data comprises one or more selected from: overlay data, critical dimension data, focus data, and/or edge placement error (EPE) data.

13. A computer program product comprising a non-transitory computer readable medium having instructions therein, the instructions, when executed by a computer system, configured to cause the computer system to at least:
obtain process parameter data relating to a plurality of substrates of a semiconductor manufacturing process;
determine a property of the process parameter data based on variation of the process parameter data between one or more pairs of subsets of the process parameter data; and
use the property of the process parameter data to one or more selected from: determine a sampling scheme configured for future metrology measurements to obtain further process parameter data, identify groups of similarity within the plurality of substrates, determine a key performance indicator of the processing, correlate the metrology data to context and/or processing data, and/or filter out noise from the process parameter data.

14. The computer program product of claim 13, wherein the instructions, when executed by the computer system, are further configured to cause the computer system to:
determine a correlation frequency spectra between different pairs of spatial frequency spectra, each pair relating to a different pair of substrates;
determine a distribution of a magnitude of correlation frequency spectra per spatial frequency; and
determine a correlation metric from the distribution of the magnitude of correlation frequency spectra per spatial frequency.

15. The computer program product of claim 14, wherein the correlation metric comprises an average of the distribution.

16. The computer program product of claim 14, wherein the instructions, when executed by the computer system, are further configured to cause the computer system to use the correlation metric to determine the significance of spatial frequencies in the process parameter data.

17. The computer program product of claim 16, wherein the instructions, when executed by the computer system, are configured to cause the computer system to use the property of the process parameter data to filter out noise from the process parameter data and the instructions, when executed by the computer system, are further configured to cause the computer system to filter out as noise, one or more spatial frequencies deemed to be insignificant.

18. The computer program product of claim 16, wherein the instructions, when executed by the computer system, are configured to cause the computer system to use the property of the process parameter data to determine a sampling scheme configured for future metrology measurements to obtain further process parameter data and the instructions, when executed by the computer system, are further configured to cause the computer system to optimize the sampling scheme for correction of one or more spatial frequencies deemed most significant.

19. The computer program product of claim 14, wherein the process parameter data is grouped by context, and wherein the instructions, when executed by the computer system, are further configured to cause the computer system to:
determine the correlation metric for each context; and
use the context based correlation metric to identify one or more dominant contributor contexts.

20. The computer program product of claim 13, wherein the process parameter data comprises one or more selected from: overlay data, critical dimension data, focus data, and/or edge placement error (EPE) data.

* * * * *